US012040349B2

(12) United States Patent
Park et al.

(10) Patent No.: US 12,040,349 B2
(45) Date of Patent: Jul. 16, 2024

(54) LIGHT EMITTING DEVICE AND METHOD OF MANUFACTURING THE SAME

(71) Applicant: Samsung Electronics Co., Ltd., Suwon-si (KR)

(72) Inventors: Kiwon Park, Suwon-si (KR); Hyunsoo Kim, Hwaseong-si (KR); Jinsu Park, Hwaseong-si (KR); Suyeol Lee, Seongnam-si (KR); Shiyoung Lee, Seoul (KR); Chiyoon Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 358 days.

(21) Appl. No.: 17/575,088

(22) Filed: Jan. 13, 2022

(65) Prior Publication Data

US 2022/0310694 A1    Sep. 29, 2022

(30) Foreign Application Priority Data

Mar. 25, 2021  (KR) .................. 10-2021-0038980

(51) Int. Cl.
*H01L 27/15* (2006.01)
*H01L 23/00* (2006.01)

(52) U.S. Cl.
CPC ............ *H01L 27/156* (2013.01); *H01L 24/02* (2013.01); *H01L 24/05* (2013.01); *H01L 24/06* (2013.01);
(Continued)

(58) Field of Classification Search
CPC ....... H01L 27/156; H01L 24/02; H01L 24/05; H01L 24/06; H01L 24/45; H01L 24/48;
H01L 2224/02381; H01L 2224/0239; H01L 2224/05554; H01L 2224/05569; H01L 2224/05573; H01L 2224/06153; H01L 2224/06155; H01L 2224/45124; H01L 2224/45139; H01L 2224/45144; H01L 2224/45147; H01L 2224/48091;
(Continued)

(56) References Cited

U.S. PATENT DOCUMENTS 6,372,608 B1   4/2002  Shimoda et al.
6,645,830 B2  11/2003  Shimoda et al.
(Continued)

FOREIGN PATENT DOCUMENTS

KR          101448153 B1  10/2014
KR     1020190122467 A    10/2019
(Continued)

*Primary Examiner* — Elias Ullah
(74) *Attorney, Agent, or Firm* — Muir Patent Law, PLLC

(57) ABSTRACT

A light emitting device includes a printed circuit board (PCB) including a connection pad, a base substrate mounted on the PCB and including a pixel region and a pad region, light emitting structures arranged on the pixel region, a barrier rib structure disposed on the pixel region and disposed at a vertical level different from the light emitting structures, the barrier rib structure including barrier ribs connected with each other to define each of pixel spaces, a phosphor layer filling each pixel space, a dam structure surrounding the barrier rib structure, a pad disposed on the pad region and adjacent to at least one side of an outer boundary of the light emitting structures, a bonding wire connecting the connection pad to the pad, and a molding structure covering the pad, the connection pad, the bonding wire, and at least a portion of the dam structure.

20 Claims, 27 Drawing Sheets

(52) U.S. Cl.
CPC ............. *H01L 24/45* (2013.01); *H01L 24/48* (2013.01); *H01L 2224/02381* (2013.01); *H01L 2224/0239* (2013.01); *H01L 2224/05554* (2013.01); *H01L 2224/05569* (2013.01); *H01L 2224/05573* (2013.01); *H01L 2224/06153* (2013.01); *H01L 2224/06155* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48105* (2013.01); *H01L 2224/48228* (2013.01); *H01L 2924/182* (2013.01)

(58) Field of Classification Search
CPC . H01L 2224/48105; H01L 2224/48228; H01L 2924/182; H01L 24/85; H01L 33/22; H01L 33/382; H01L 2224/04042; H01L 2224/48227; H01L 2224/48484; H01L 2224/85203; H01L 2224/85207; H01L 2224/8592; H01L 33/62; H01L 25/0753; H01L 33/52
See application file for complete search history.

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,030,670 B2 | 10/2011 | Kim et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,952,501 B2 | 2/2015 | Huang et al. |
| 9,209,124 B2 | 12/2015 | Huang et al. |
| 9,437,478 B2 | 9/2016 | Ho et al. |
| 10,998,375 B2 | 5/2021 | Lee et al. |
| 2019/0326349 A1 | 10/2019 | Kwon et al. |

FOREIGN PATENT DOCUMENTS

| | | |
|---|---|---|
| KR | 1020200055862 A | 5/2020 |
| WO | 2020087496 A1 | 5/2020 |

LIGHT EMITTING DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2021-0038980, filed on Mar. 25, 2021, in the Korean Intellectual Property Office, the disclosure of which is incorporated by reference herein in its entirety.

BACKGROUND

The inventive concept relates to a light emitting device and a method of manufacturing the same, and more particularly, to a pixel-type semiconductor light emitting device and a method of manufacturing the same.

Demand for using the light emitting devices in various lighting devices such as vehicle headlamps and interior lighting has increased. For example, to use a light source module including a plurality of light emitting devices, an intelligence lighting system for implementing various lighting modes according to surrounding conditions by separately controlling the light emitting devices has been proposed. However, to implement such an intelligent lighting system, it is necessary to improve optical characteristics and reliability of the light emitting devices.

SUMMARY

The inventive concept provides a pixel-type semiconductor light emitting device having excellent optical characteristics and reliability and a method of manufacturing the same.

The problems to be solved by the technical spirit of the inventive concept are not limited to the problems mentioned above, and other problems not mentioned will be clearly understood by those skilled in the art from the following descriptions.

According to an embodiment of the present inventive concept, a light emitting device includes a printed circuit board (PCB) including a connection pad, a base substrate mounted on the PCB and including a light emitting pixel region and a pad region, a plurality of light emitting structures arranged on the light emitting pixel region, a barrier rib structure disposed on the light emitting pixel region and disposed at a vertical level different from the plurality of light emitting structures, the barrier rib structure including a plurality of barrier ribs connected with each other to define each of a plurality of pixel spaces, a phosphor layer filling an inside of each of the plurality of pixel spaces, a dam structure surrounding the barrier rib structure, a pad disposed on the pad region and being adjacent to at least one side of an outer boundary of the plurality of light emitting structures, a bonding wire connecting the connection pad to the pad, and a molding structure covering the pad, the connection pad, the bonding wire, and at least a portion of the dam structure.

According to an embodiment of the present invention, a light emitting device includes a printed circuit board (PCB) including a connection pad, a base substrate mounted on the PCB and including a light emitting pixel region and a pad region, a plurality of light emitting structures arranged on the light emitting pixel region, a barrier rib structure disposed on the light emitting pixel region and disposed at a vertical level different from the plurality of light emitting structures, the barrier rib structure including a plurality of barrier ribs connected with each other to define a plurality of pixel spaces, a phosphor layer filling an inside of each of the plurality of pixel spaces, a pad disposed on the pad region and being adjacent to at least one side of an outer boundary of the plurality of light emitting structures, a bonding wire connecting the connection pad to the pad, and a molding structure covering the pad, the connection pad, the bonding wire, and at least a portion of an outer portion of the barrier rib structure. The outer portion of the barrier rib structure includes a stepped outer portion, and the molding structure covers the stepped outer portion.

According to an embodiment of the present inventive concept, a light emitting device includes a printed circuit board (PCB) including a connection pad, a base substrate mounted on the PCB and including a light emitting pixel region and a pad region, a plurality of light emitting structures arranged on the light emitting pixel region, a barrier rib structure disposed on the light emitting pixel region and disposed at a vertical level different from the light emitting structures, the barrier rib structure including a plurality of barrier ribs connected with each other to define a plurality of pixel spaces, a phosphor layer filling an inside of each of the plurality of pixel spaces, a pad disposed on the pad region and being adjacent to at least one side of an outer boundary of the plurality of light emitting structures, a bonding wire connecting the connection pad to the pad, and a molding structure covering the pad, the connection pad, the bonding wire, and at least a portion of an outer portion of the barrier rib structure. The outer portion of the barrier rib structure includes a rounded outer portion, and the molding structure covers the rounded outer portion.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the technical idea of the inventive concept will be described in detail with reference to the accompanying drawings.

Figure 1A:
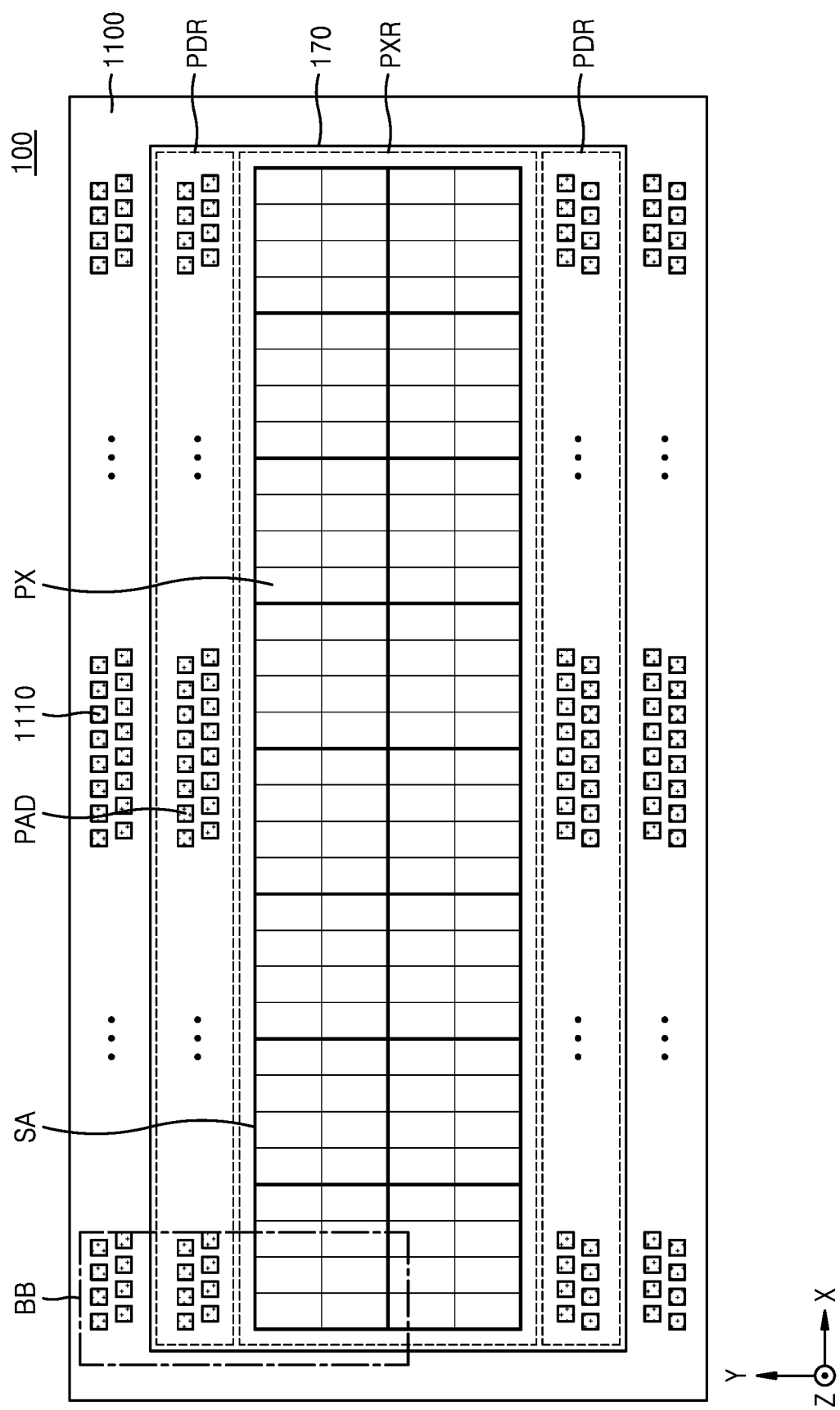
FIG. 1A is a plan view illustrating a light emitting device according to an embodiment of the inventive concept.
Figure 1B:
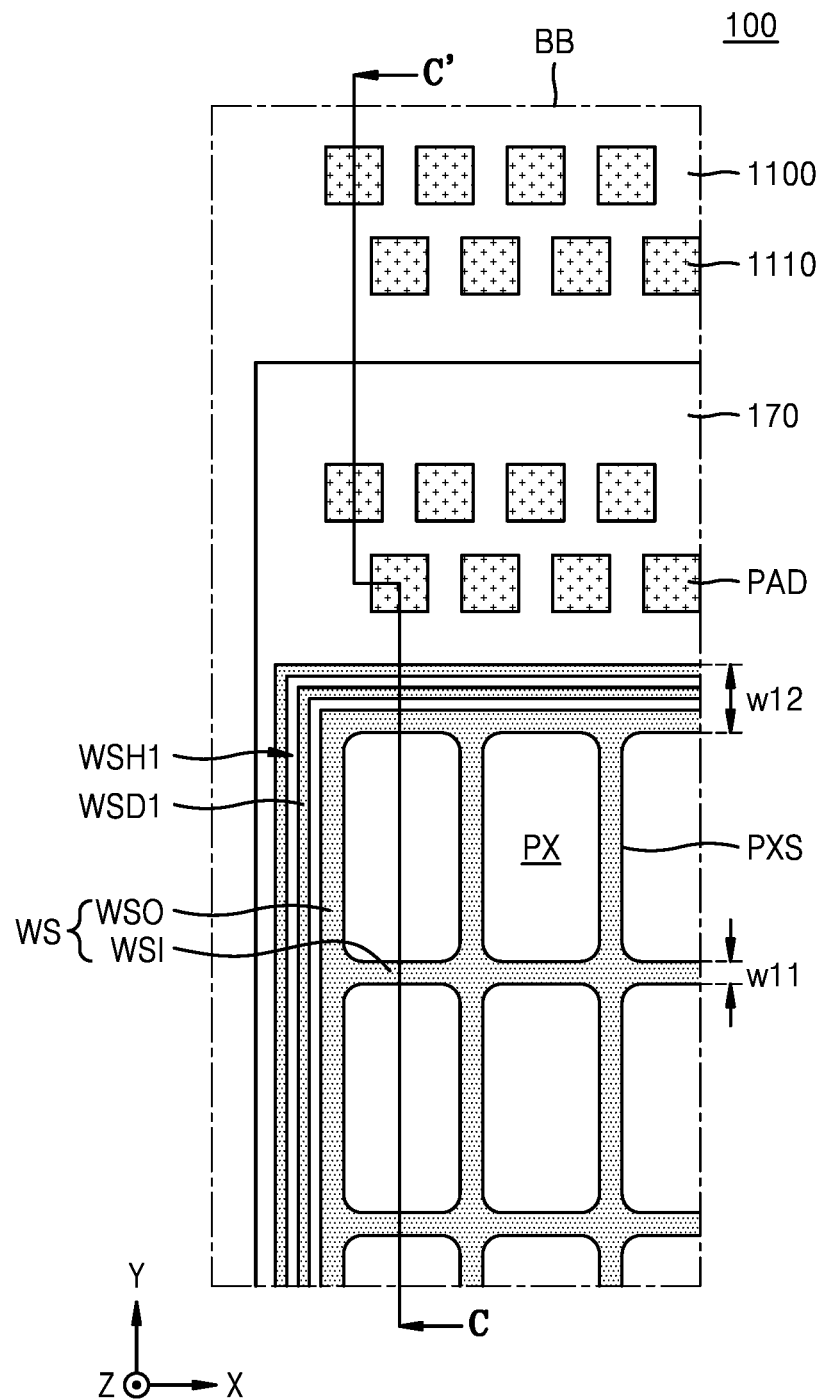
FIG. 1B is an enlarged view of a portion BB of FIG. 1A.
Figure 1C:
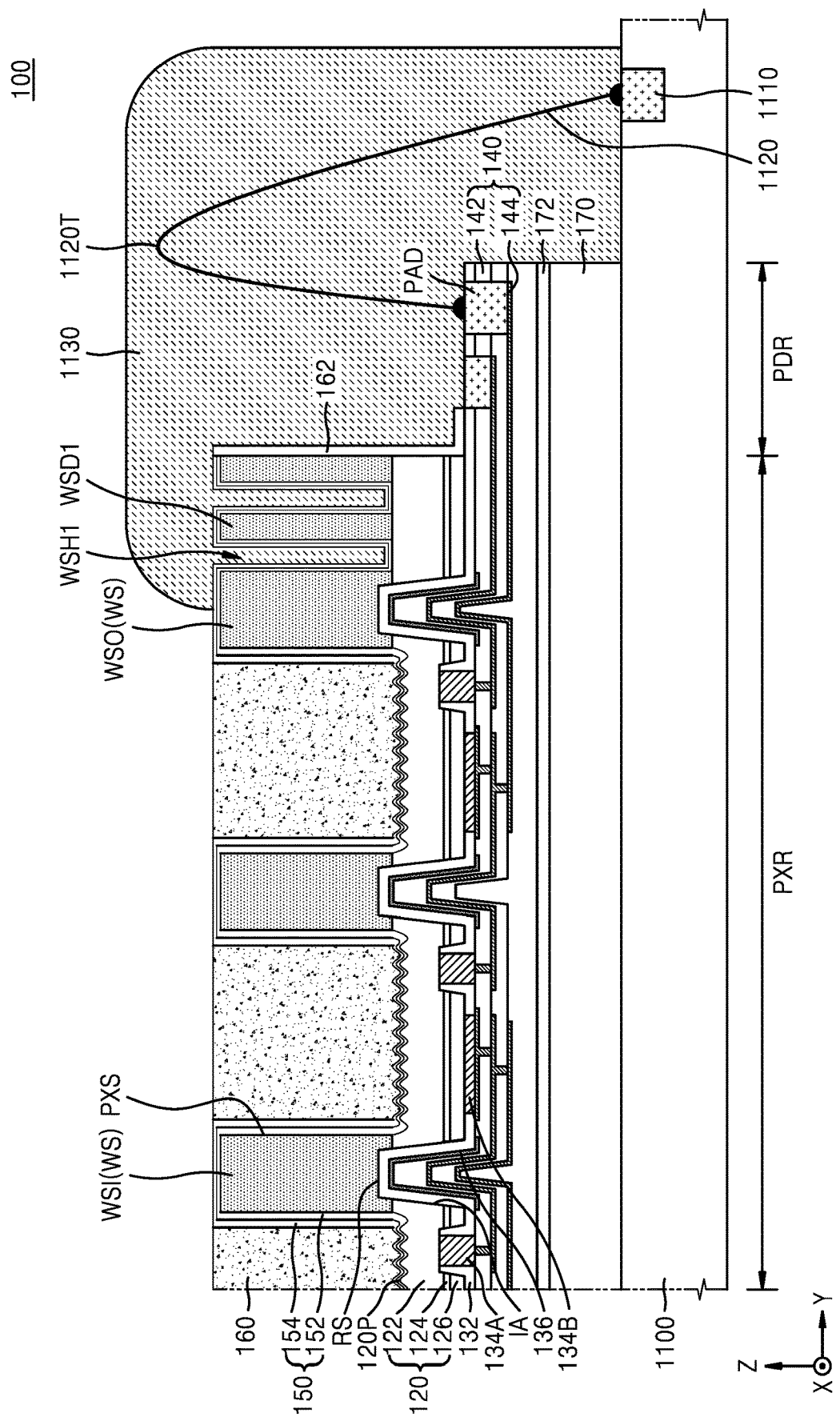
FIG. 1C is a cross-sectional view taken along line C-C' of FIG. 1B.

FIG. 1A is a plan view illustrating a light emitting device 100 according to an embodiment of the inventive concept, FIG. 1B is an enlarged view of a portion BB of FIG. 1A, and FIG. 1C is a cross-sectional view taken along line C-C' of FIG. 1B.

Referring to FIGS. 1A to 1C together, the light emitting device 100 may include a light emitting pixel region PXR and a pad region PDR positioned on at least one side of the light emitting pixel region PXR on a base substrate 170 mounted on a printed circuit board (PCB) 1100. In some embodiments, the pad region PDR may be adjacent to at least one side of an outer boundary of the light emitting pixel region PXR on which the pixels PX are disposed (i.e., at least one side of an outer boundary of the pixels PX).

A plurality of pixels PX may be arranged in a matrix form on the light emitting pixel region PXR, and a plurality of light emitting structures 120 may be positioned in the pixels PX, respectively. A pad portion PAD (i.e., a pad) electrically connected to the light emitting structure 120 positioned in each pixel PX may be positioned in the pad region PDR.

In a plan view of the light emitting device 100, the light emitting pixel region PXR may have an area corresponding to about 50% to about 90% of a total area of the light emitting device 100, and the pad region PDR may have an area corresponding to about 10% to about 50% of the total area of the light emitting device 100, but is not limited thereto. In the plan view of the light emitting device 100, each pixel PX may have, for example, an X-direction width or a Y-direction width of about 10 µm to several mm, but is not limited thereto. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The light emitting device 100 may include a plurality of sub-arrays SA, and each of the sub-arrays SA may include the pixels PX. As illustrated, the light emitting device 100 may include 16 sub-arrays SA, and each of the sub-arrays SA may include 8 pixels PX arranged in a matrix form. However, the arrangement of the sub-arrays SA and the number of pixels PX included in each of the sub-arrays SA is not limited thereto.

In some embodiments, each of the sub-arrays SA may be electrically isolated from each other, and the pixels PX included in one sub-array SA may be connected in series with each other. For example, each of the sub-arrays SA may be electrically connected to the same driving semiconductor chip (not shown), and thus, one driving semiconductor chip may be configured to control one sub-array SA. The number of sub-arrays SA may be equal to the number of driving semiconductor chips. In some embodiments, pixels PX included in at least one of the sub-arrays SA may be connected to each other in parallel.

A barrier rib structure WS may be positioned on the light emitting structures 120. As illustrated, the barrier rib structure WS may include a plurality of barrier ribs WSI defining a plurality of pixel spaces PXS in the light emitting pixel region PXR and an outer barrier rib WSO positioned at the outermost portions of the barrier ribs WSI. The pixel PX may be positioned in each of the pixel spaces PXS. In some embodiments, the plurality of barrier ribs WSI may be connected to each other to define each of the plurality of pixel spaces PXS.

Each of the barrier ribs WSI may have a first width w11 in a range of about 10 µm to 100 µm in a horizontal direction (i.e., a Y direction). The outer barrier rib WSO may have a second width w12 in a range of about 10 µm to 1 mm in a horizontal direction (i.e., the Y direction). The barrier rib structure WS may be formed such that the outer barrier rib WSO has the second width w12 greater than the first width w11 of the barrier ribs WSI, and thus, the structural stability of the light emitting device 100 may be improved. For example, even in an environment in which repeated vibrations and shocks are applied to the light emitting device 100, such as the light emitting device 100 used as a vehicle headlamp, the reliability of the light emitting device 100 may be improved by excellent structural stability between a phosphor layer 160 positioned in the barrier rib structure WS and the barrier rib structure WS.

In the light emitting device 100 of the inventive concept, a dam structure WSD1 may be positioned to surround the outer barrier rib WSO. In some embodiments, the dam structure WSD1 may form a portion of the outer barrier rib WSO. A first space WSH1 may be positioned between the barrier rib structure WS and the dam structure WSD1. In an example process, the outer barrier rib WSO and the dam structure WSD1 surrounding the outer barrier rib WSO may be formed by etching a portion of the barrier rib structure WS. In an example embodiment, the barrier rib structure WS may include or may be formed of substantially the same material as that of the dam structure WSD1. In an example embodiment, a level of an upper surface of the barrier rib structure WS may be substantially equal to a level of an upper surface of the dam structure WSD1. In an example embodiment, the dam structure WSD1 may be positioned between the barrier rib structure WS and the pad portion PAD. For example, the dam structure WSD1 may be positioned between an outermost region of the barrier rib structure WS and the pad region PDR at which the pad portion PAD is formed. In some embodiments, the dam structure WSD1 may include a plurality of dams spaced apart from each other, and may be positioned in a direction sequentially away from the barrier rib structure WS. The dams may be positioned to be spaced apart from each other at substantially the same interval, for example, an interval of the first space WSH1. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

A vertical level of a bottom surface of the first space WSH1 may be equal to or lower than a vertical level of a lower surface of the barrier rib structure WS. As illustrated, the bottom surface of the first space WSH1 may be substantially at the same level as upper surfaces of the plurality of light emitting structures 120. Alternatively, over-etching may be performed so that a bottom surface of the first space WSH1 may be at a level lower than the upper surfaces of the light emitting structures 120. The first space WSH1 may have a continuous line shape and may be formed to surround the outermost portion of the barrier rib structure WS. As will be described later, at least a portion of the first space WSH1 may be filled with a molding material constituting a molding structure 1130.

The light emitting structures 120 may each include a first conductivity-type semiconductor layer 122, an active layer 124, and a second conductivity-type semiconductor layer 126. An insulating liner 132, a first contact 134A, a second contact 134B, and a wiring structure 140 may be positioned on a bottom surface of each of the light emitting structures 120.

Here, a surface of the light emitting structure 120 facing the barrier ribs WSI may be referred to as the upper surface of the light emitting structure 120, and the other surface of the light emitting structure 120 opposite to the upper surface of the light emitting structure 120 may be referred to as the bottom surface of the light emitting structure 120. In some embodiments, the barrier ribs WSI may be closer to the upper surface of the light emitting structure 120 than the bottom surface of the light emitting structure 120. For example, the first conductivity-type semiconductor layer 122, the active layer 124, and the second conductivity-type semiconductor layer 126 may be vertically stacked on each other from the upper surface to the bottom surface of the light emitting structure 120, and accordingly, the upper surface of the light emitting structure 120 may correspond to an upper surface of the first conductivity-type semiconductor layer 122, and the bottom surface of the light emitting structure 120 may correspond to a bottom surface of the second conductivity-type semiconductor layer 126.

The first conductivity-type semiconductor layer 122 may be a nitride semiconductor having a composition of n-type $In_xAl_yGa_{(1-x-y)}N$ ($0 \leq x<1$, $0 \leq y<1$, and $0 \leq x+y<1$), and, for example, n-type impurities may include or may be formed of silicon (Si). Alternatively, the first conductivity-type semiconductor layer 122 may include or may be formed of GaN including n-type impurities.

In some embodiments, the first conductivity-type semiconductor layer 122 may include a first conductivity-type semiconductor contact layer and a current diffusion layer. An impurity concentration of the first conductivity-type semiconductor contact layer may be in a range of about $2 \times 10^{18}$ cm$^{-3}$ to about $9 \times 10^{19}$ cm$^{-3}$. A thickness of the first conductivity-type semiconductor contact layer may be about 1 μm to about 5 μm. The current diffusion layer may have a structure in which a plurality of $In_xAl_yGa_{(1-x-y)}N$ ($0 \leq x$, $y \leq 1$, $0 \leq x+y \leq 1$) layers having different compositions or different impurity contents are alternately stacked on each other. Alternatively, the current diffusion layer may have an n-type superlattice structure in which an n-type GaN layer and/or an $Al_xIn_yGa_zN$ ($0 \leq x$, $y$, $z \leq 1$, and $x+y+z \neq 0$) layer, each having a thickness of about 1 nm to about 500 nm, are alternately stacked on each other. An impurity concentration of the current diffusion layer may be in a range of about $2 \times 10^{18}$ cm$^{-3}$ to about $9 \times 10^{19}$ cm$^{-3}$.

The active layer 124 may be positioned between the first conductivity-type semiconductor layer 122 and the second conductivity-type semiconductor layer 126. The active layer 124 may be configured to emit light having certain energy by recombination of electrons and holes when the light emitting device 100 is driven. The active layer 124 may have a multi-quantum well (MQW) structure in which a quantum well layer and a quantum barrier layer are alternately stacked on each other. For example, the quantum well layer and the quantum barrier layer may include $In_xAl_yGa_{(1-x-y)}N$ ($0 \leq x$, $y \leq 1$, $0 \leq x+y \leq 1$) layers having different compositions. Alternatively, the quantum well layer may include an $In_xGa_{1-x}N$ ($0 \leq x \leq 1$) layer, and the quantum barrier layer may include a GaN layer or an AlGaN layer. A thickness of the quantum well layer and the quantum barrier layer may range from about 1 nm to about 50 nm. The active layer 124 is not limited to an MQW structure, and may have a single quantum well structure.

The second conductivity-type semiconductor layer 126 may be a nitride semiconductor layer having a composition of p-type $In_xAl_yGa_{(1-x-y)}N$ ($0 \leq x<1$, $0 \leq y<1$, $0 \leq x+y<1$), and a p-type impurity may include or may be formed of, for example, magnesium (Mg).

In some embodiments, the second conductivity-type semiconductor layer 126 may include an electron blocking layer, a low concentration p-type GaN layer, and a high concentration p-type GaN layer stacked in a vertical direction. For example, the electron blocking layer may have a structure in which a plurality of $In_xAl_yGa_{(1-x-y)}N$ layers ($0 \leq x$, $y \leq 1$ and $0 \leq x+y \leq 1$) having different compositions and having a thickness of about 5 nm to about 100 nm are alternately stacked on each other, or may be a single layer including an $Al_yGa_{(1-y)}N$ ($0<y \leq 1$) layer. An energy bandgap of the electron blocking layer may decrease in a direction away from the active layer 124. For example, an aluminum (Al) composition of the electron blocking layer may decrease in the direction away from the active layer 124.

Each of the light emitting structures 120 may be positioned to be spaced apart from a neighboring light emitting structure 120 with a device isolation region IA therebetween.

The insulating liner 132 may be conformally positioned on an inner wall of the device isolation region IA to cover a side surface of each of the light emitting structures 120. The insulating liner 132 may be positioned on an inner wall of an opening penetrating the active layer 124 and the second conductivity-type semiconductor layer 126. In some embodiments, the insulating liner 132 may include or may be formed of silicon oxide, silicon oxynitride, or silicon nitride. In some embodiments, the insulating liner 132 may have a structure in which a plurality of insulating layers are stacked on each other.

The first contact 134A may be positioned to be connected to the first conductivity-type semiconductor layer 122 in the opening penetrating the active layer 124 and the second conductivity-type semiconductor layer 126. The second contact 134B may be positioned on the bottom surface of the second conductivity-type semiconductor layer 126. The insulating liner 132 may electrically insulate the first contact 134A from the active layer 124 and the second conductivity-type semiconductor layer 126. The insulating liner 132 may be positioned between the first contact 134A and the second contact 134B on the bottom surface of the second conductivity-type semiconductor layer 126, and may electrically insulate the first contact 134A from the second contact 134B. The first contact 134A and the second contact 134B may include or may be formed of metal such as Ag, Al, Ni, Cr, Au, Pt, Pd, Sn, W, Rh, Ir, Ru, Mg, Zn, Ti, Cu, and combinations thereof. The first contact 134A and the second contact 134B may include or may be formed of metal having high reflectivity.

A lower reflective layer 136 may be positioned on the insulating liner 132 positioned on an inner wall of the device isolation region IA. The lower reflective layer 136 may reflect light emitted through sidewalls of the light emitting structures 120 and redirect the light into the pixel spaces PXS.

In some embodiments, the lower reflective layer 136 may include or may be formed of metal such as Ag, Al, Ni, Cr, Au, Pt, Pd, Sn, W, Rh, Ir, Ru, Mg, Zn, Ti, Cu, and combinations thereof. The lower reflective layer 136 may include or may be formed of metal having high reflectivity. In some embodiments, the lower reflective layer 136 may be a distributed Bragg reflector. For example, the distributed Bragg reflector may have a structure in which a plurality of insulating layers having different refractive indices are repeatedly stacked on each other. Each of the insulating layers included in the distributed Bragg reflector may include or may be formed of an oxide or nitride such as SiN, $SiO_xN_y$, $TiO_2$, $Si_3N_4$, $Al_2O_3$, TiN, AlN, $ZrO_2$, TiAlN, TiSiN, and combinations thereof.

The wiring structure 140 may be positioned on the insulating liner 132, the first contact 134A, the second contact 134B, and the lower reflective layer 136. The wiring structure 140 may include a plurality of insulating layers 142 and a plurality of wiring layers 144. The wiring layers 144 may electrically connect each of the first contact 134A and the second contact 134B to the pad portion PAD. Some of the wiring layers 144 may be positioned on the inner wall of the device isolation region IA, and the insulating layers 142 may cover the wiring layers 144, respectively, and fill the device isolation region IA. As illustrated, the wiring layers 144 may include two or more wiring layers 144 positioned at different levels in a vertical direction, but are not limited thereto. Each of the wiring layers 144 may include or may be formed of metal such as Ag, Al, Ni, Cr, Au, Pt, Pd, Sn, W, Rh, Ir, Ru, Mg, Zn, Ti, Cu, and combinations thereof.

The pad portion PAD connected to the wiring layers 144 may be positioned in the pad region PDR, and the pad portion PAD may be positioned at a vertical level lower than the barrier rib structure WS. In some embodiments, sidewalls and bottom surfaces of the pad portion PAD may be covered by the insulating layers 142, and an upper surface of the pad portion PAD may be at a level lower than the upper surface of the light emitting structures 120. In some embodiments, unlike illustrated, some of the light emitting structures 120 may be positioned on the pad region PDR, and the pad portion PAD may be positioned in an opening (not shown) formed in the light emitting structures 120, and an upper surface of the pad portion PAD may be at the same level as the upper surfaces of the light emitting structures 120. A bonding wire 1120 for electrical connection to a connection pad 1110 of the PCB 1100 may be positioned on the pad portion PAD. For convenience of description, the bonding wire 1120 is omitted in FIGS. 1A and 1B.

The barrier rib structure WS may be positioned on the upper surfaces of the light emitting structures 120. The barrier rib structure WS may include or may be formed of silicon (Si), silicon carbide (SiC), sapphire, or gallium nitride (GaN). In an example process, the barrier rib structure WS may be formed by forming the light emitting structures 120 on a substrate 110 (see FIG. 9A) and then removing a portion of the substrate 110 (see FIG. 9A). The barrier rib structure WS may be a portion of the substrate 110 (see FIG. 9A) for forming the light emitting structure 120.

The barrier ribs WSI may be arranged in a matrix form in a plan view, and the pixel spaces PXS may be defined by the barrier ribs WSI. Each of the barrier ribs WSI may include a recess region RS positioned to vertically overlap the device isolation region IA at a bottom portion of each of the barrier ribs WSI. The recess region RS may be formed by removing a portion of the substrate 110 (see FIG. 9A) together in an etching process for separating a light emitting stack 120L (see FIG. 9A) into the light emitting structures 120. The insulating liner 132 may be positioned to contact the recess region RS on a bottom surface of each of the barrier ribs WSI.

Upper surfaces of the light emitting structures 120 may be exposed from the bottom portions of the pixel spaces PXS. In some embodiments, an uneven portion 120P may be formed on an upper surface of each of the light emitting structures 120 positioned at the bottom portions of the pixel spaces PXS. Light extraction efficiency from the light emitting structures 120 may be improved by the uneven portion 120P. However, the technical spirit of the inventive concept is not limited thereto, and the uneven portion 120P may not be formed.

A passivation structure 150 may be positioned on an upper surface and sidewalls of each of the barrier ribs WSI. The passivation structure 150 may include a first passivation layer 152 and a second passivation layer 154 conformally positioned on upper surfaces and sidewalls of each of the barrier ribs WSI. The passivation structure 150 may be conformally positioned on the upper surface of the light emitting structure 120 positioned at the bottom portion of each of the pixel spaces PXS.

In some embodiments, the first passivation layer 152 may include or may be formed of a first insulating material, and the second passivation layer 154 may include or may be formed of a second insulating material, the second insulating material being different from the first insulating material. Each of the first and second insulating materials may include or may be formed of at least one of silicon oxide, silicon nitride, silicon oxynitride, aluminum oxide, and aluminum nitride.

In some embodiments, the first passivation layer 152 may have a relatively uniform thickness on the sidewalls of each of the barrier ribs WSI. The second passivation layer 154 may have a relatively uniform thickness on the sidewalls of each of the barrier ribs WSI. In an example process, the first and second passivation layers 152 and 154 may be formed with a material having excellent step coverage or using an atomic layer deposition (ALD) process, which is a manufacturing process for forming a material having excellent step coverage.

Although not shown, a sidewall reflective layer may be positioned on the sidewall of each of the barrier ribs WSI. The sidewall reflective layer may include or may be formed of a highly reflective material such as a metal layer including Ag, Al, Ni, Cr, Au, Pt, Pd, Sn, W, Rh, Ir, Ru, Mg, Zn, and combinations thereof, and may reflect light emitted from the light emitting structures 120. A protective layer (not shown) may be further formed on the sidewall reflective layer.

The phosphor layer 160 may be positioned in the pixel spaces PXS on the upper surface of the light emitting structures 120. As illustrated, the phosphor layer 160 may entirely fill the pixel spaces PXS on the passivation structure 150. An upper surface of the phosphor layer 160 may be at the same level as the upper surfaces of the barrier ribs WSI, but is not limited thereto.

The phosphor layer 160 may include or may be formed of a single type of material capable of converting light emitted from the light emitting structure 120 into a desired color. For example, the phosphor layer 160 related to the same color may be positioned in the pixel spaces PXS. Alternatively, a color of the phosphor layer 160 positioned in some of the pixel spaces PXS may be different from a color of the phosphor layer 160 positioned in the other pixel spaces PXS.

The phosphor layer 160 may include or may be formed of a resin in which phosphor is dispersed or a film containing phosphor. For example, the phosphor layer 160 may include or may be formed of a phosphor film in which phosphor particles are uniformly dispersed at a certain concentration. The phosphor particles may be a wavelength conversion material converting a wavelength of light emitted from the light emitting structures 120 to a different wavelength. To improve a density and color uniformity of the phosphor particles, the phosphor layer 160 may include two or more kinds of phosphor particles having different size distributions.

In some embodiments, the phosphor may have various compositions and colors, such as oxide-based phosphor, silicate-based phosphor, nitride-based phosphor, and fluorite-based phosphor. For example, $\beta$-SiAlON:$Eu^{2+}$ (green), (Ca,Sr)AlSiN$_3$:$Eu^{2+}$ (red), La$_3$Si$_6$N$_{11}$:$Ce^{3+}$ (yellow), K$_2$SiF$_6$:$Mn_4^+$ (red), SrLiAl$_3$N$_4$:Eu (red), Ln$_{4-x}$(Eu$_z$M$_{1-z}$)$_x$Si$_{12-y}$Al$_y$O$_{3+x+y}$N$_{18-x-y}$ ($0.5 \leq x \leq 3$, $0 < z < 0.3$, and $0 < y \leq 4$) (red), K$_2$TiF$_6$:$Mn_4^+$ (red), NaYF$_4$:$Mn_4^+$ (red), or NaGdF$_4$:$Mn_4^+$ (red) may be used as the phosphor. However, the kind of the phosphor is not limited thereto.

In some embodiments, a wavelength conversion material such as quantum dots may be further positioned on the phosphor layer 160. The quantum dots may have a core-shell structure using a group III-V or group II-VI compound semiconductor. For example, the quantum dots may have a core such as CdSe and InP and a shell such as ZnS and ZnSe. In addition, the quantum dots may include a ligand for stabilizing the core and the shell.

The base substrate 170 may be positioned under the wiring structure 140, and an adhesive layer 172 may be positioned between the base substrate 170 and the wiring structure 140. In some embodiments, the adhesive layer 172 may include an electrically insulating material, for example, a polymer material such as silicon oxide, silicon nitride, a UV curable material, and a resin. In some embodiments, the adhesive layer 172 may include a eutectic adhesive material such as AuSn and NiSi. The base substrate 170 may include, but is not limited to, a sapphire substrate, a glass substrate, a transparent conductive substrate, a silicon substrate, or a silicon carbide substrate.

The PCB 1100 may be positioned under the base substrate 170. The PCB 1100 may include a conductive pattern layer (not shown) therein and may include a connection pad 1110 electrically connected to the conductive pattern layer. The base substrate 170 is mounted on the PCB 1100, and the pad portion PAD may be electrically connected to the connection pad 1110 of the PCB 1100 through the bonding wire 1120.

A body portion of the PCB 1100 may be implemented by compressing a polymer material such as a thermosetting resin, an epoxy resin (such as flame retardant 4 (FR-4), bismaleimide triazine (BT), and Ajinomoto build up film (ABF)), and a phenol resin to a certain thickness to form a thin structure, applying a copper foil on opposite surfaces thereof, and subsequently forming an internal wiring, which is a path for transferring an electrical signal, through patterning.

The PCB 1100 may be a single layer PCB in which an internal wiring is formed on only one surface or a double layer PCB in which an internal wiring is formed on opposite surfaces. The present inventive concept is not limited thereto. In some embodiments, the PCB 1100 may include three or more copper foil layers formed using an insulator called prepreg, and three or more internal wirings formed according to the number of copper foil layers to implement a multilayer PCB.

The bonding wire 1120 may be formed to electrically connect the pad portion PAD to the connection pad 1110. At least one of a control signal, a power signal, and a ground signal for an operation of the light emitting device 100 may be provided from the outside through the bonding wire 1120. A material of the bonding wire 1120 may include or may be formed of at least one of gold (Au), silver (Ag), copper (Cu), and aluminum (Al). In some embodiments, the bonding wire 1120 may be connected by any one of a thermo compression connection method and an ultrasonic connection method or may also be connected by a thermosonic connection method as a combination of the thermo compression connection method and the ultrasonic connection method. The bonding wire 1120 may be formed as a loop having a curvature. For example, the bonding wire 1120 may include a curved portion which forms the loop. A height from the upper surface of the connection pad 1110 to the uppermost surface 1120T of the bonding wire 1120 may be referred to as a loop height. In some embodiments, a level of the uppermost surface 1120T of the loop height formed by the bonding wire 1120 (i.e., a level of the uppermost surface 1120T of the curved portion of the bonding wire 1120) may be higher than a level of the uppermost surface of the barrier rib structure WS.

The molding structure 1130 may have a round upper surface to cover the pad portion PAD, the connection pad 1110, and the bonding wire 1120, while enclosing the outermost portion of the barrier rib structure WS. To prevent the bonding wire 1120 from being exposed to the outside, a thickness of the molding structure 1130 on the PCB 1100 may be formed to be greater than the loop height of the bonding wire 1120. The molding structure 1130 may be positioned to cover a side surface of the base substrate 170 and a portion of the upper surface of the PCB 1100. In the light emitting device 100 of the inventive concept, the molding structure 1130 may be formed to fill at least a portion of the first space WSH1. For example, the first space WSH1 and the dam structure WSD1 may prevent the molding structure 1130 from flowing along an upper surface of the barrier rib structure WS and penetrating into the light emitting pixel region PXR.

The molding structure 1130 may include or may be formed of, for example, an epoxy molding compound. In some embodiments, the molding structure 1130 is not limited to an epoxy molding compound and may include or may be formed of various other materials such as an epoxy-based material, a thermosetting material, a thermoplastic material, a UV-treated material, and black silicone. An exterior of the molding structure 1130 is formed by injecting an appropriate amount of a molding material and performing a curing process. Process conditions such as a delay time between injection of the molding material and pressurization, the amount of the injected molding material, and a pressurization temperature/pressure may be set considering physical properties such as the viscosity of the molding material.

A light source module including a plurality of light emitting devices may be used for an intelligent lighting system such as a vehicle headlamp, and various lighting modes may be implemented according to surrounding conditions by individually controlling each of the light emitting devices. Using the light emitting devices arranged in a matrix form in the intelligent lighting system may cause a phenomenon in which light emitted from each of the light emitting devices is mixed with another light or penetrates into an adjacent light emitting device, thereby degrading contrast characteristics of the light source module.

However, in embodiments of the inventive concept, the barrier rib structure WS on the light emitting structures 120 may reduce or prevent a phenomenon in which light from a pixel PX is mixed with light from an adjacent pixel PX or light from a pixel penetrates into an adjacent pixel. The phosphor layer 160 may be firmly fixed in each pixel space PXS by the barrier rib structure WS, and even in a situation in which repeated vibrations and shocks are applied to the light emitting device 100 used as a vehicle headlamp, the phosphor layer 160 may remain fixed in each pixel space PXS, thereby improving the reliability of the light emitting device 100.

However, depending on material properties of the molding material of the molding structure 1130, a portion of the molding material may escape from the barrier rib structure WS and flow into even an upper surface of the pixels PX in the light emitting pixel region PXR. The escaped portion of the molding material of the molding structure 1130 may cover a portion of light emitting pixel region PXR, thereby causing optical defects such as blurring.

To solve this, in the light emitting device 100 according to the technical idea of the inventive concept, the first space WSH1 and the dam structure WSD1 are provided to surround the outer barrier rib WSO to thereby efficiently prevent the escaped portion of the molding material of the molding structure 1130 from flowing into the light emitting pixel region PXR, and thus, the pixel-type semiconductor light emitting device 100 having excellent optical characteristics and reliability may be provided.

Figure 2:
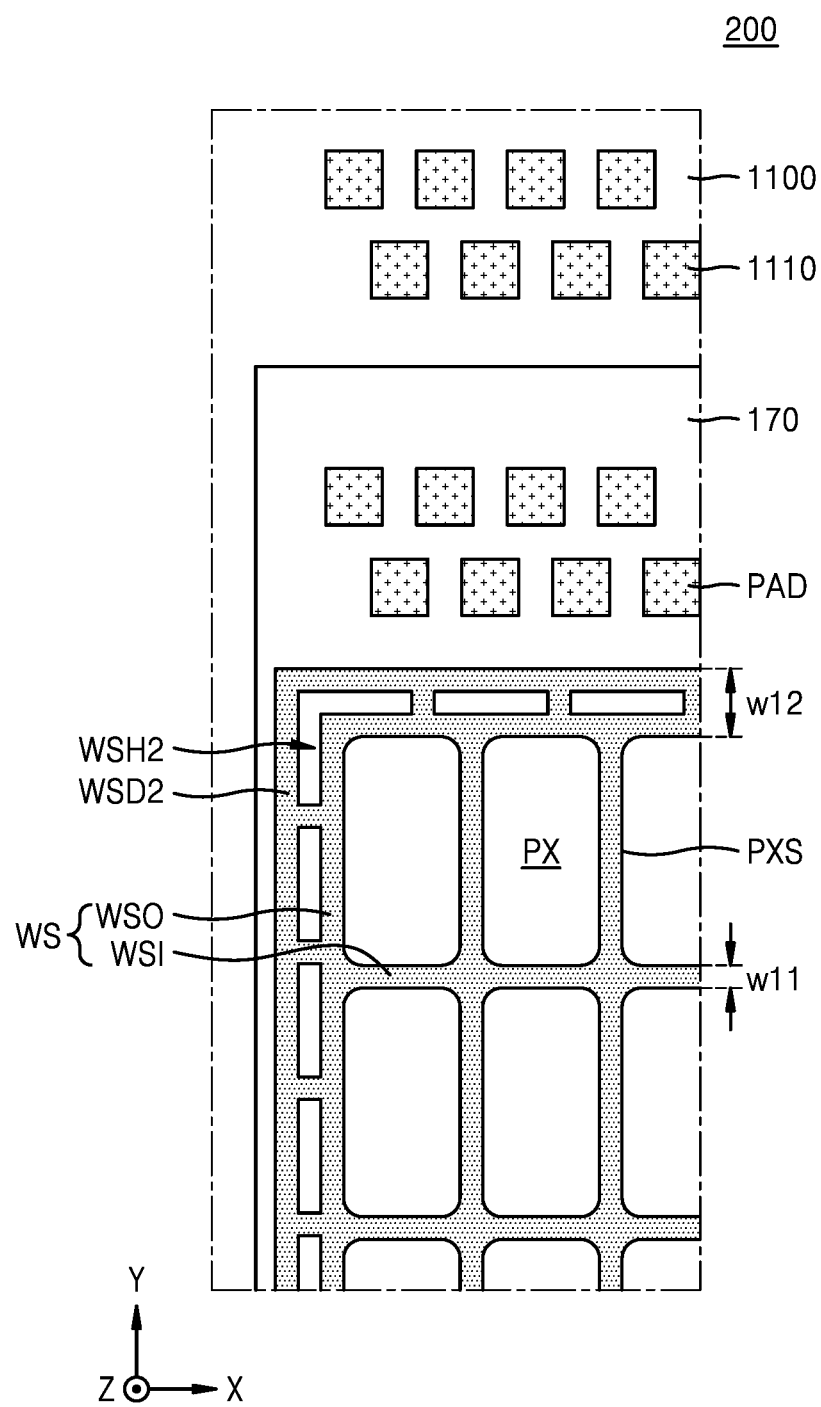
FIGS. 2 to 4 are partially enlarged views illustrating light emitting devices, respectively, according to embodiments of the inventive concept.
Figure 3:
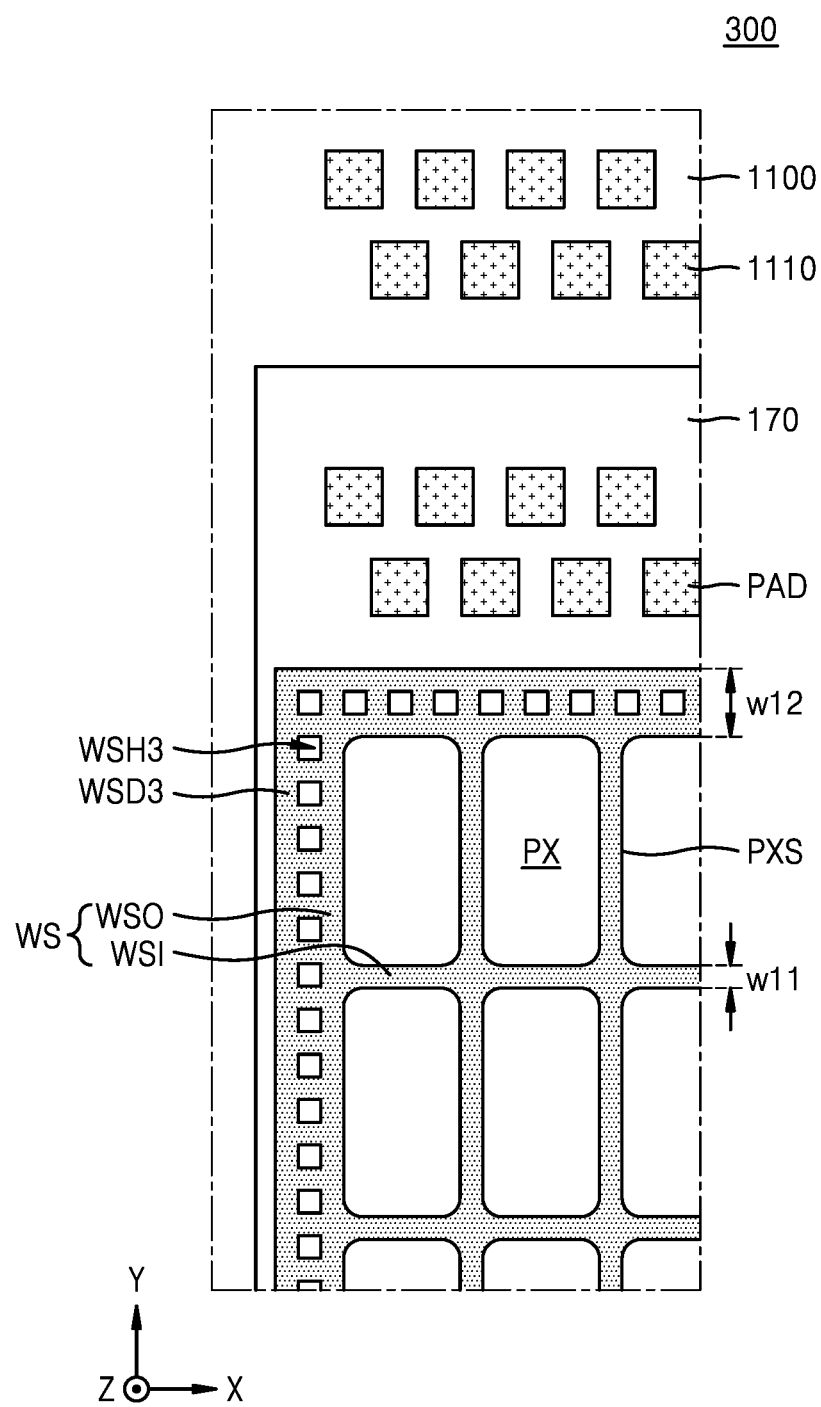
Figure 4:
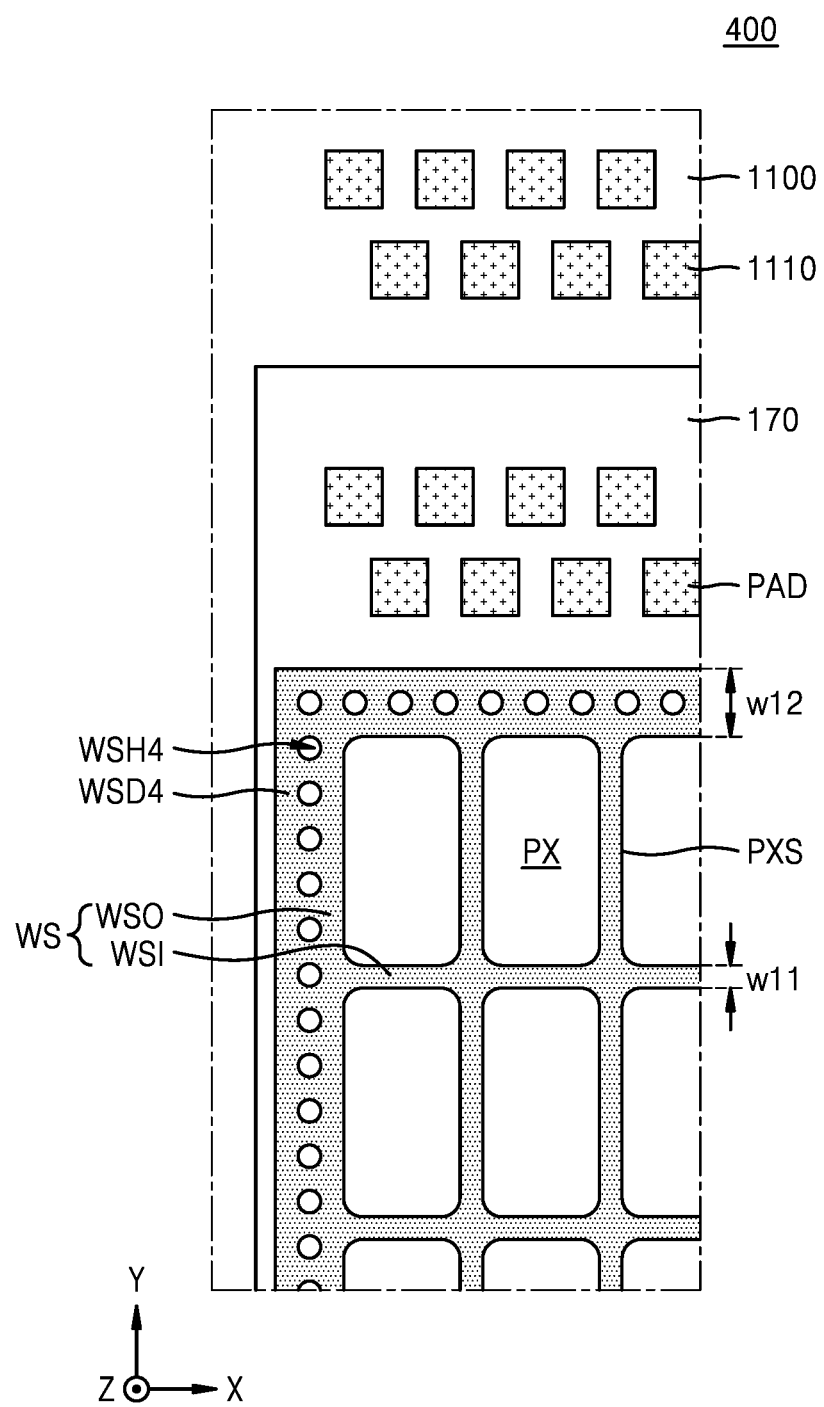

FIGS. 2 to 4 are partially enlarged views illustrating light emitting devices 200, 300, and 400, respectively, according to other embodiments of the inventive concept.

Most of the components constituting the light emitting devices 200, 300, and 400 described below and materials constituting the components are substantially the same as or similar to those described above with reference to FIGS. 1A to 1C. Therefore, for convenience of description, differences from the light emitting device 100 described above will be mainly described based on partially enlarged views.

Referring to FIG. 2, the light emitting device 200 may include second spaces WSH2 separated at regular intervals in the outer barrier rib WSO.

In the light emitting device 200 of the present embodiment, a dam structure WSD2 may be positioned to surround the outer barrier rib WSO. The second spaces WSH2 separated at regular intervals may be positioned in a line shape between the barrier rib structure WS and the dam structure WSD2. In an example process, the outer barrier rib WSO and the dam structure WSD2 surrounding the outer barrier rib WSO may be formed by etching a portion of the barrier rib structure WS. In an example embodiment, the barrier rib structure WS may include or may be formed of substantially the same material as that of the dam structure WSD2. In an example embodiment, a level of an upper surface of the barrier rib structure WS may be substantially the same as a level of an upper surface of the dam structure WSD2. In an example embodiment, the dam structure WSD2 may be positioned between the barrier rib structure WS and the pad portion PAD.

At least some of the second spaces WSH2 may be filled with the molding structure 1130 (see FIG. 1C).

Referring to FIG. 3, the light emitting device 300 may include third spaces WSH3 separated at regular intervals in the outer barrier rib WSO.

In the light emitting device 300 of the present embodiment, a dam structure WSD3 may be positioned to surround the outer barrier rib WSO. The third spaces WSH3 separated at the regular intervals may have a rectangle shape and may be positioned between the barrier rib structure WS and the dam structure WSD3. In an example process, the outer barrier rib WSO and the dam structure WSD3 surrounding the outer barrier rib WSO may be formed by etching a portion of the barrier rib structure WS. In an example embodiment, the barrier rib structure WS may include or may be formed of substantially the same material as that of the dam structure WSD3. In an example embodiment, a level of an upper surface of the barrier rib structure WS may be substantially the same as a level of an upper surface of the dam structure WSD3. In an example embodiment, the dam structure WSD3 may be positioned between the barrier rib structure WS and the pad portion PAD.

At least some of the third spaces WSH3 may be filled with the molding structure 1130 (see FIG. 1C).

Referring to FIG. 4, the light emitting device 400 may include fourth spaces WSH4 separated at regular intervals in the outer barrier rib WSO.

In the light emitting device 400 of the present embodiment, a dam structure WSD4 may be positioned to surround the outer barrier rib WSO. The fourth spaces WSH4 separated at regular intervals may have a circle shape and may be positioned between the barrier rib structure WS and the dam structure WSD4. In an example process, the outer barrier rib WSO and the dam structure WSD4 surrounding the outer barrier rib WSO may be formed by etching a portion of the barrier rib structure WS. In an example embodiment, the barrier rib structure WS may include or may be formed of substantially the same material as that of the dam structure WSD4. In an example embodiment, a level of an upper surface of the barrier rib structure WS may be substantially the same as a level of an upper surface of the dam structure WSD4. In an example embodiment, the dam structure WSD4 may be positioned between the barrier rib structure WS and the pad portion PAD.

At least some of the fourth spaces WSH4 may be filled with the molding structure 1130 (see FIG. 1C).

FIGS. 5 to 8 are cross-sectional views illustrating light emitting devices 500, 600, 700, and 800, respectively, according to other embodiments of the inventive concept.

Most of the components constituting the light emitting devices 500, 600, 700, and 800 described below and materials constituting the components are substantially the same as or similar to those described above with reference to FIGS. 1A to 1C. Therefore, for convenience of description, differences from the light emitting device 100 described above will be mainly described based on cross-sectional views.

Figure 5:
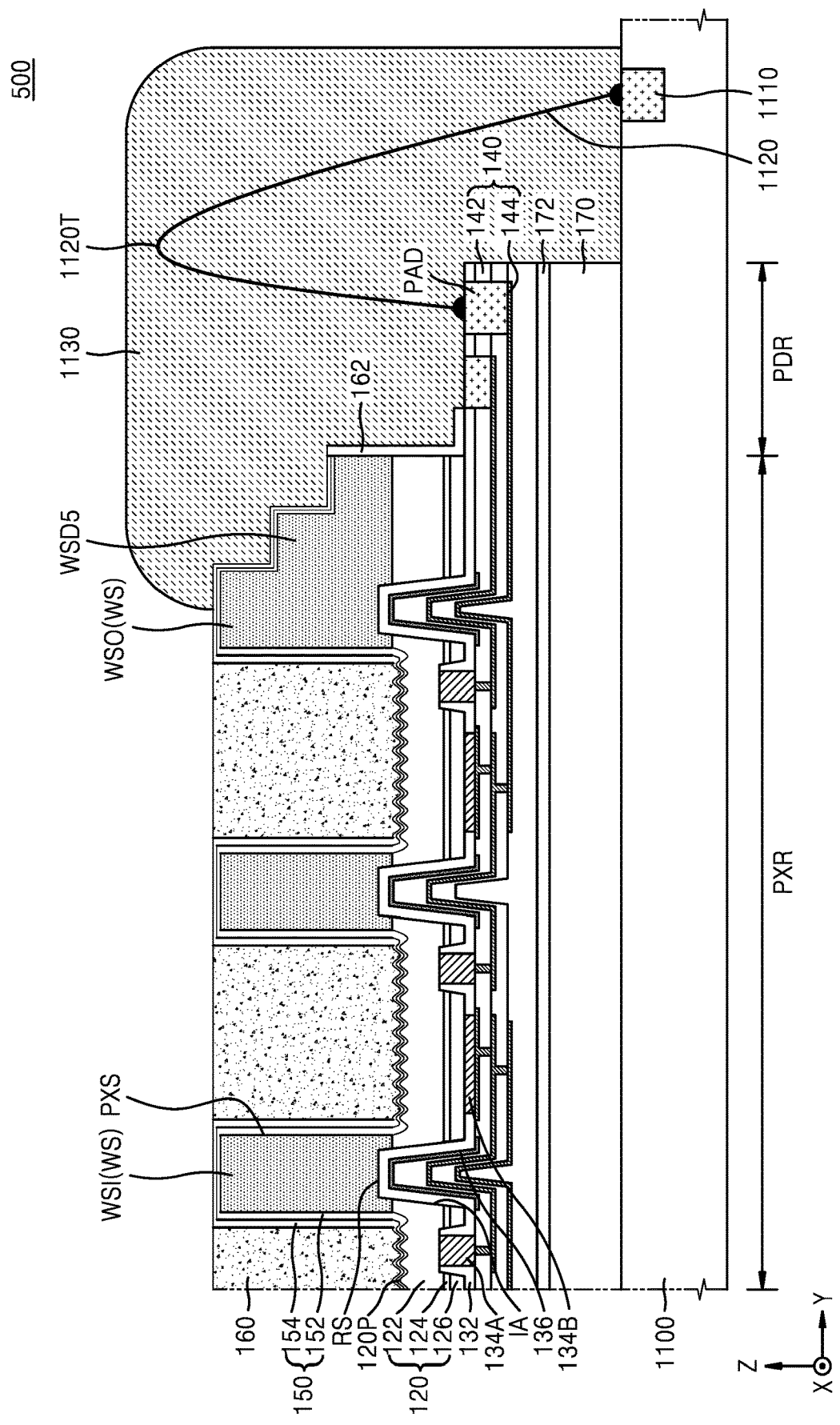
FIGS. 5 to 8 are cross-sectional views illustrating light emitting devices, respectively, according to embodiments of the inventive concept.

Referring to FIG. 5, in the light emitting device 500, the outer barrier rib WSO may include a step structure WSD5 (i.e., a stepped outer portion) having a step shape.

In the light emitting device 500 of the present embodiment, the step structure WSD5 may be positioned to surround the outer barrier rib WSO. In an example process, the outer barrier rib WSO and the step structure WSD5 surrounding the outer barrier rib WSO may be formed by etching a portion of the barrier rib structure WS. In an example embodiment, the barrier rib structure WS may include or may be formed of substantially the same material as that of the step structure WSD5. In an example embodiment, the step structure WSD5 may be positioned between the barrier rib structure WS and the pad portion PAD.

The molding structure 1130 (see FIG. 1C) may be positioned on at least a portion of the step structure WSD5.

Figure 6:
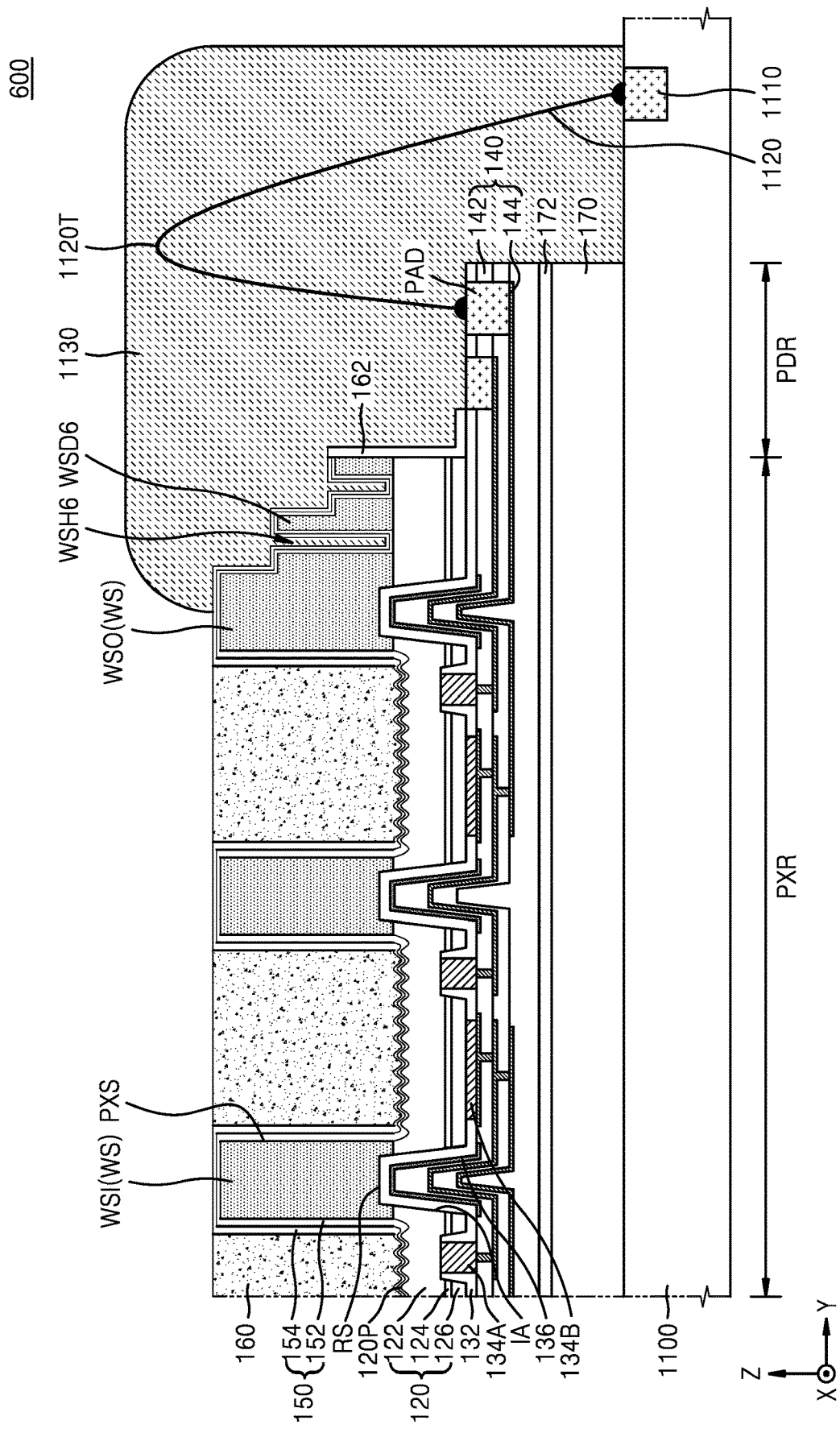

Referring to FIG. 6, in the light emitting device 600, the outer barrier rib WSO may include a step structure WSD6 (i.e., a stepped outer portion) having a step shape and a sixth space WSH6.

In the light emitting device 600 of the present embodiment, the step structure WSD6 may be positioned to surround the outer barrier rib WSO. The sixth spaces WSH6 separated at regular intervals may be positioned in a portion of the step structure WSD6. In an example process, the outer barrier rib WSO and the step structure WSD6 surrounding the outer barrier rib WSO may be formed by etching a portion of the barrier rib structure WS. In an example embodiment, the barrier rib structure WS may include or may be formed of substantially the same material as that of the step structure WSD6. In an example embodiment, the step structure WSD6 may be positioned between the barrier rib structure WS and the pad portion PAD.

The molding structure 1130 (see FIG. 1C) may be positioned in at least a portion of the step structure WSD6 and at least a portion of the sixth space WSH6.

Figure 7:
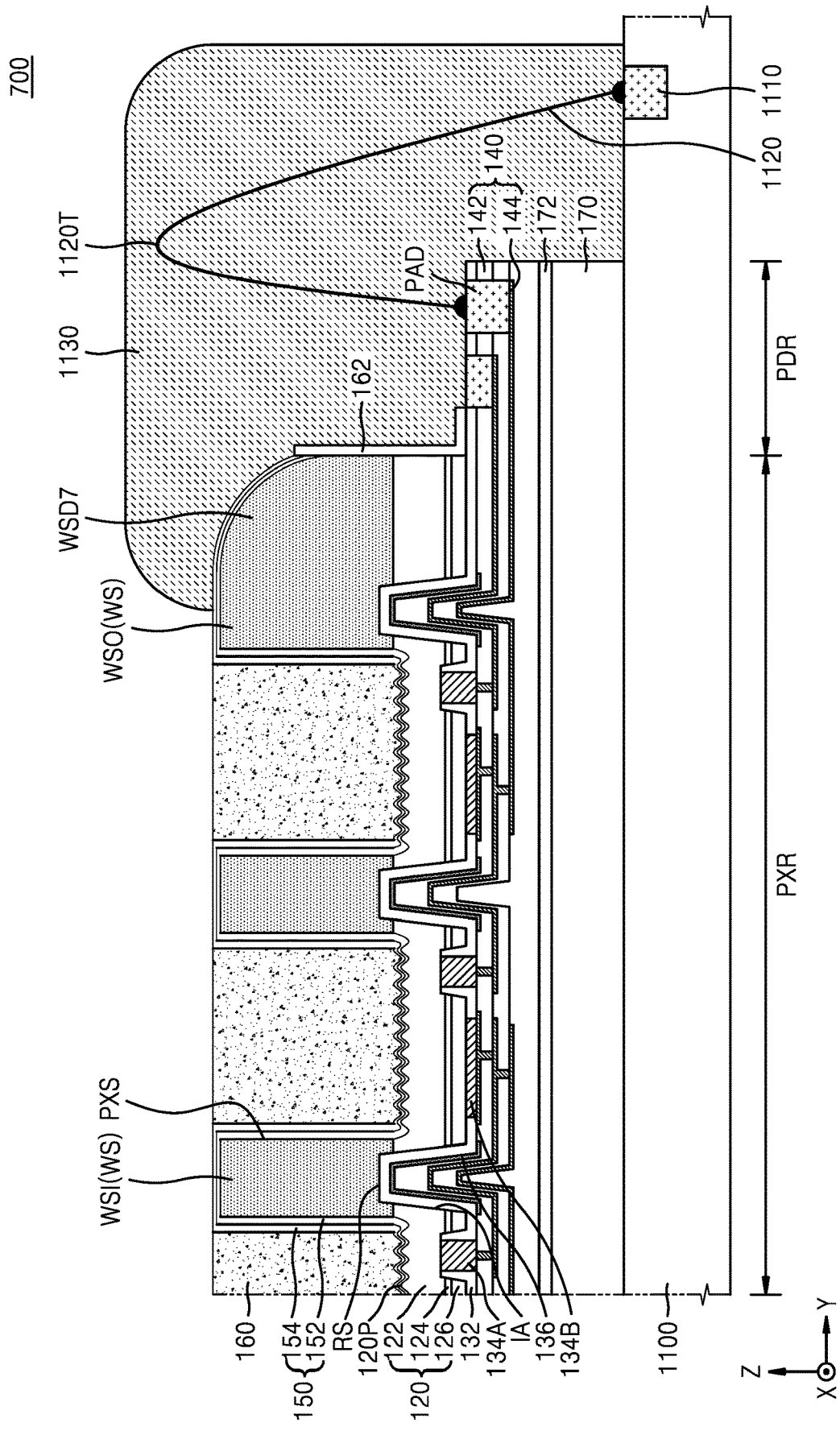

Referring to FIG. 7, in the light emitting device 700, the outer barrier rib WSO may include a curved structure WSD7 (i.e., a rounded outer portion) having a round shape.

In the light emitting device 700 of the present embodiment, the curved structure WSD7 may be positioned to surround the outer barrier rib WSO. In an example process, the outer barrier rib WSO and the curved structure WSD7 surrounding the outer barrier rib WSO may be formed by etching a portion of the barrier rib structure WS. In an example embodiment, the barrier rib structure WS may include or may be formed of substantially the same material as that of the curved structure WSD7. In an example embodiment, the curved structure WSD7 may be positioned between the barrier rib structure WS and the pad portion PAD.

The molding structure 1130 (see FIG. 1C) may be positioned on at least a portion of the curved structure WSD7.

Figure 8:
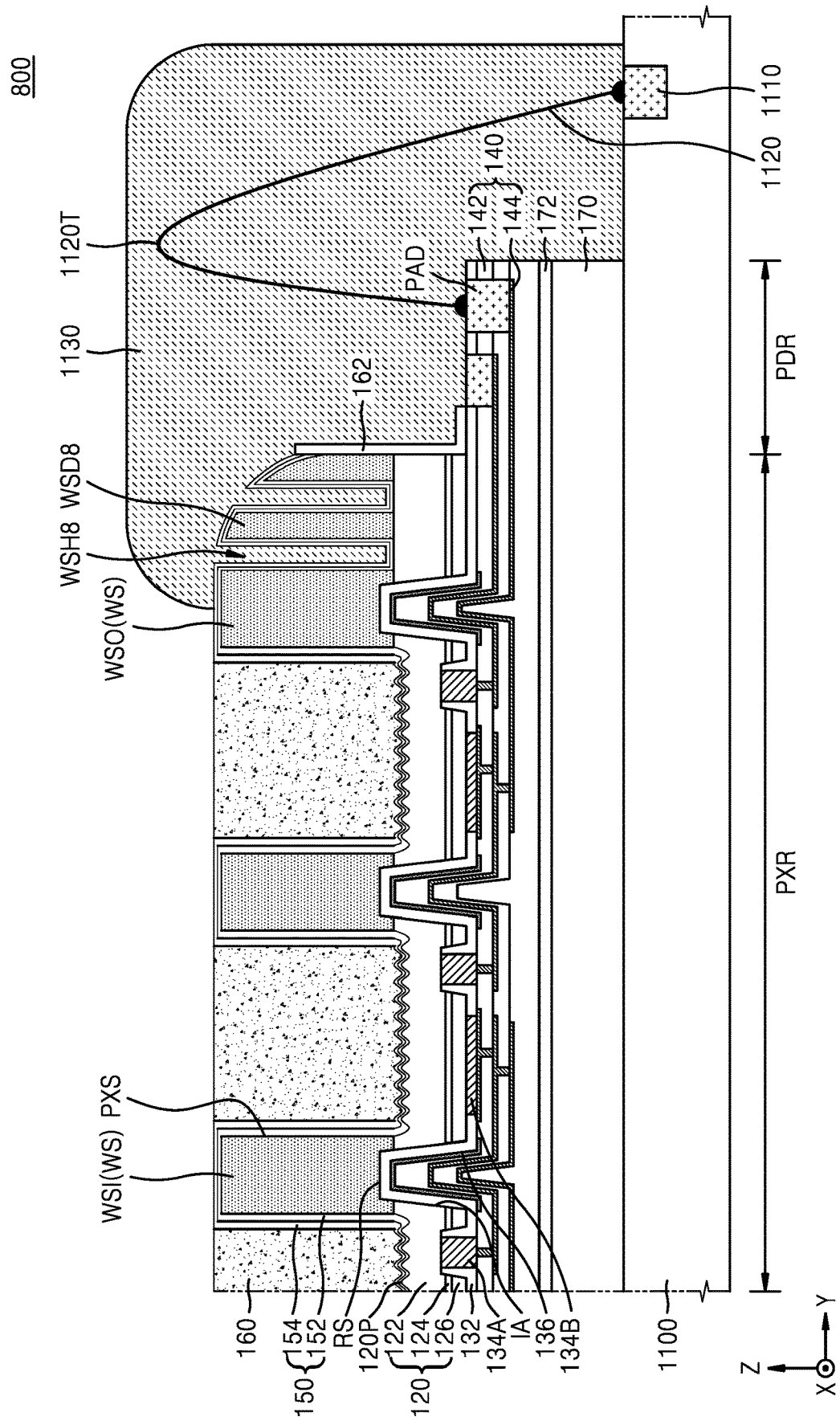

Referring to FIG. 8, in the light emitting device 800, the outer barrier rib WSO may include a curved structure WSD8 (i.e., a rounded outer portion) having a round shape and an eighth space WSH8.

In the light emitting device 800 of the present embodiment, the curved structure WSD8 may be positioned to surround the outer barrier rib WSO. The eighth spaces WSH8 separated at regular intervals may be positioned in a portion of the curved structure WSD8. In an example process, the outer barrier rib WSO and the curved structure WSD8 surrounding the outer barrier rib WSO may be formed by etching a portion of the barrier rib structure WS. In an example embodiment, the barrier rib structure WS may include or may be formed of substantially the same material as that of the curved structure WSD8. In an example embodiment, the curved structure WSD8 may be positioned between the barrier rib structure WS and the pad portion PAD.

The molding structure 1130 (see FIG. 1C) may be positioned in at least a portion of the curved structure WSD8 and at least a portion of the eighth space WSH8.

FIGS. 9A to 9M are cross-sectional views illustrating a method of manufacturing a light emitting device according to a process sequence of an example embodiment of the inventive concept.

Figure 9A:
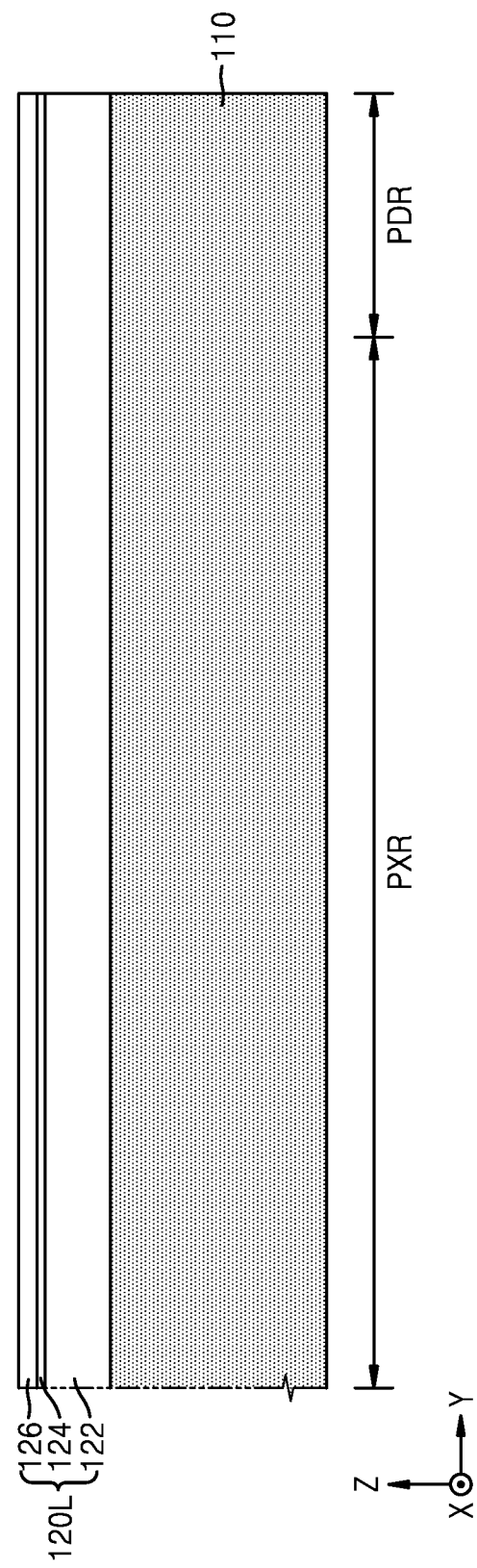
FIGS. 9A to 9M are cross-sectional views illustrating a method of manufacturing a light emitting device, according to a process sequence of an example embodiment of the inventive concept.

Referring to FIG. 9A, a light emitting stack 120L may be formed on a substrate 110.

In some embodiments, the substrate 110 may include or may be formed of a silicon (Si) substrate, a silicon carbide (SiC) substrate, a sapphire substrate, or a gallium nitride (GaN) substrate. The substrate 110 may include a pixel region PXR (i.e., a light emitting pixel region) and a pad region PDR, and the pad region PDR may be positioned on at least one side of the pixel region PXR in a plan view. For example, the pad region PDR may be adjacent to at least one side of an outer boundary of the pixel region PXR.

The light emitting stack 120L may include a first conductivity-type semiconductor layer 122, an active layer 124, and a second conductivity-type semiconductor layer 126 sequentially formed on an upper surface of the substrate 110.

Figure 9B:
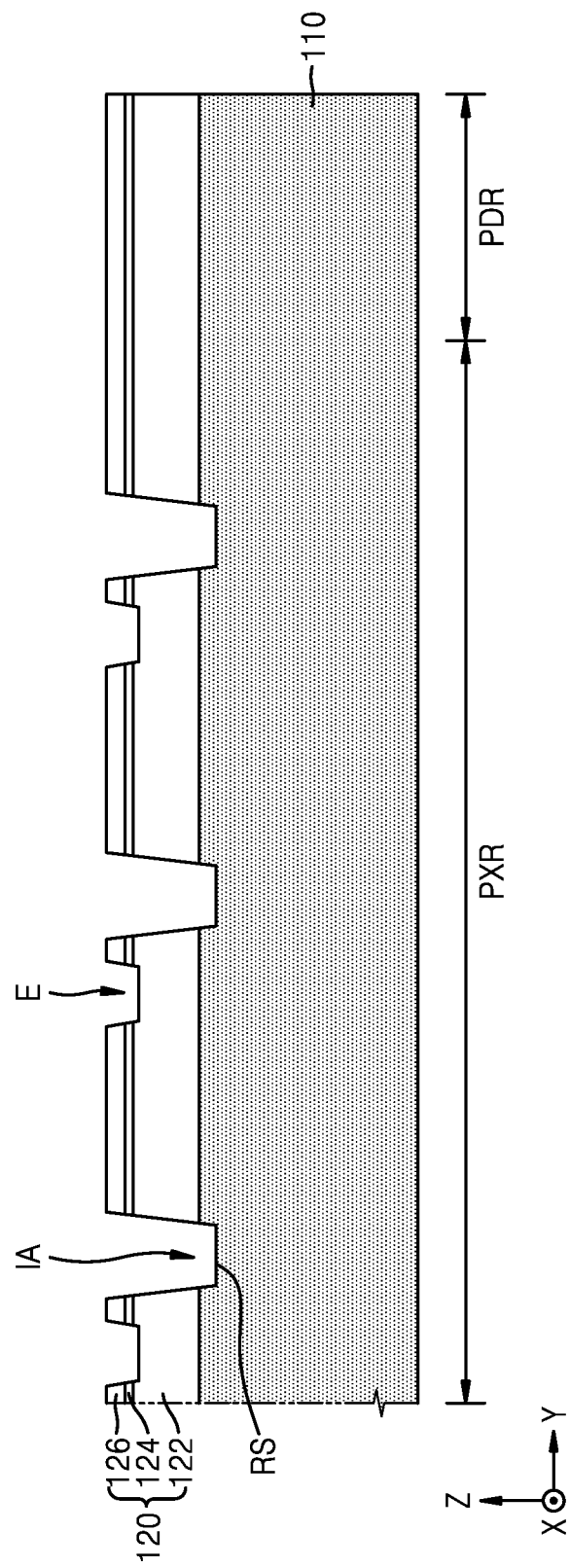

Referring to FIG. 9B, a mask pattern (not shown) may be formed on the light emitting stack 120L, and a portion of the light emitting stack 120L may be removed using the mask pattern as an etch mask to form an opening E.

The opening E may expose an upper surface of the first conductivity-type semiconductor layer 122. The opening E may not be formed on the pad region PDR of the substrate 110.

Thereafter, a mask pattern (not shown) may be formed, and a portion of the light emitting stack 120L may be removed using the mask pattern as an etch mask to form a device isolation region IA. A plurality of light emitting structures 120 spaced apart from each other by the device isolation region IA may be formed.

In some embodiments, the process of forming the device isolation region IA may be performed by a blade, but is not limited thereto. As illustrated, a lateral cross-section of the light emitting structures 120 obtained by the process of forming the device isolation region IA may have a trapezoidal shape, but is not limited thereto. In the process of forming the device isolation region IA, a portion of the substrate 110 may be removed to form a recess region RS in the substrate 110.

Figure 9C:
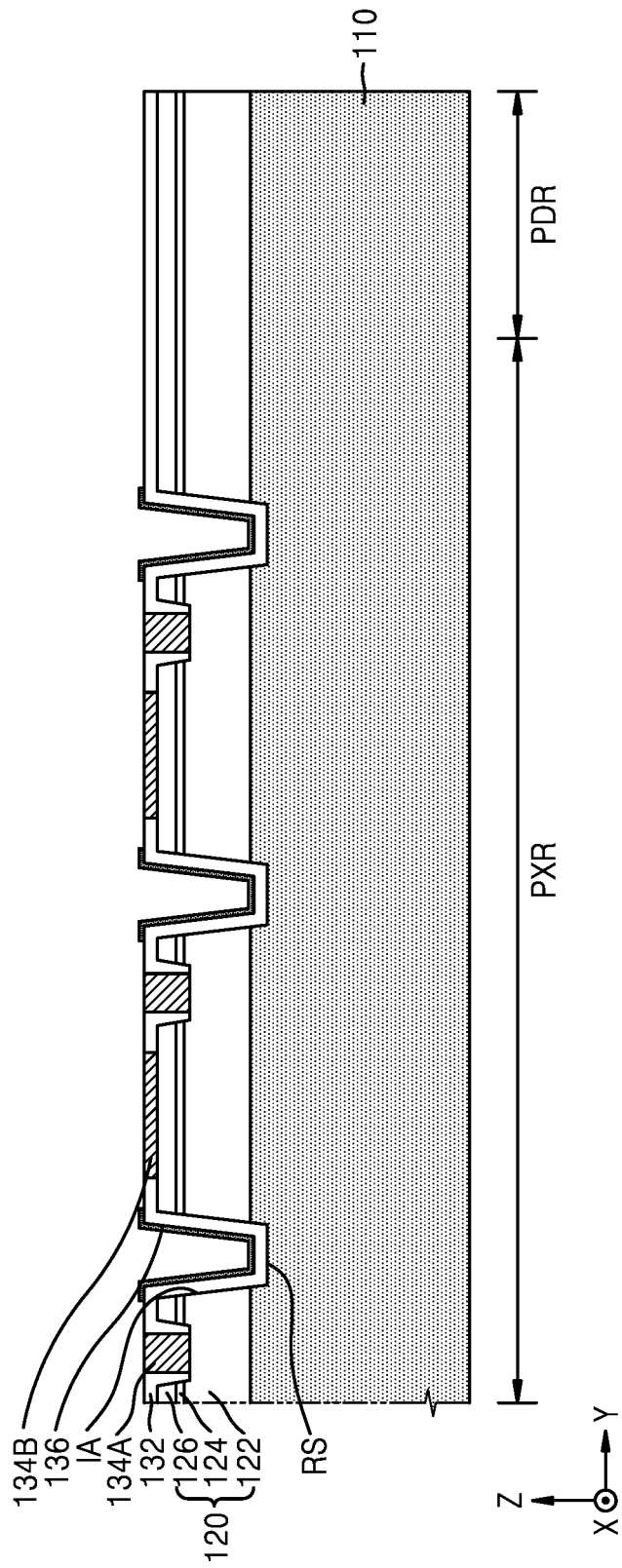

Referring to FIG. 9C, an insulating liner 132 may be formed to conformally cover the light emitting structures 120.

Next, a portion of the insulating liner 132 may be removed to expose an upper surface of the second conductivity-type semiconductor layer 126, and a second contact 134B may be formed on the exposed upper surface of the second conductivity-type semiconductor layer 126. In some embodiments, before forming the second contact 134B, an ohmic metal layer including a conductive ohmic material may be further formed on the upper surface of the second conductivity-type semiconductor layer 126.

Thereafter, a portion of the insulating liner 132 may be removed in the opening E to expose the upper surface of the first conductivity-type semiconductor layer 122, and a first contact 134A may be formed on the exposed upper surface of the first conductivity-type semiconductor layer 122. In some embodiments, before forming the first contact 134A, an ohmic metal layer including a conductive ohmic material may be further formed on the upper surface of the first conductivity-type semiconductor layer 122.

Thereafter, a lower reflective layer 136 may be formed on the insulating liner 132 along an inner wall of the device isolation region IA. In some embodiments, the lower reflective layer 136 may be simultaneously formed in the process of forming the first contact 134A or may be simultaneously formed in the process of forming the second contact 134B.

Figure 9D:
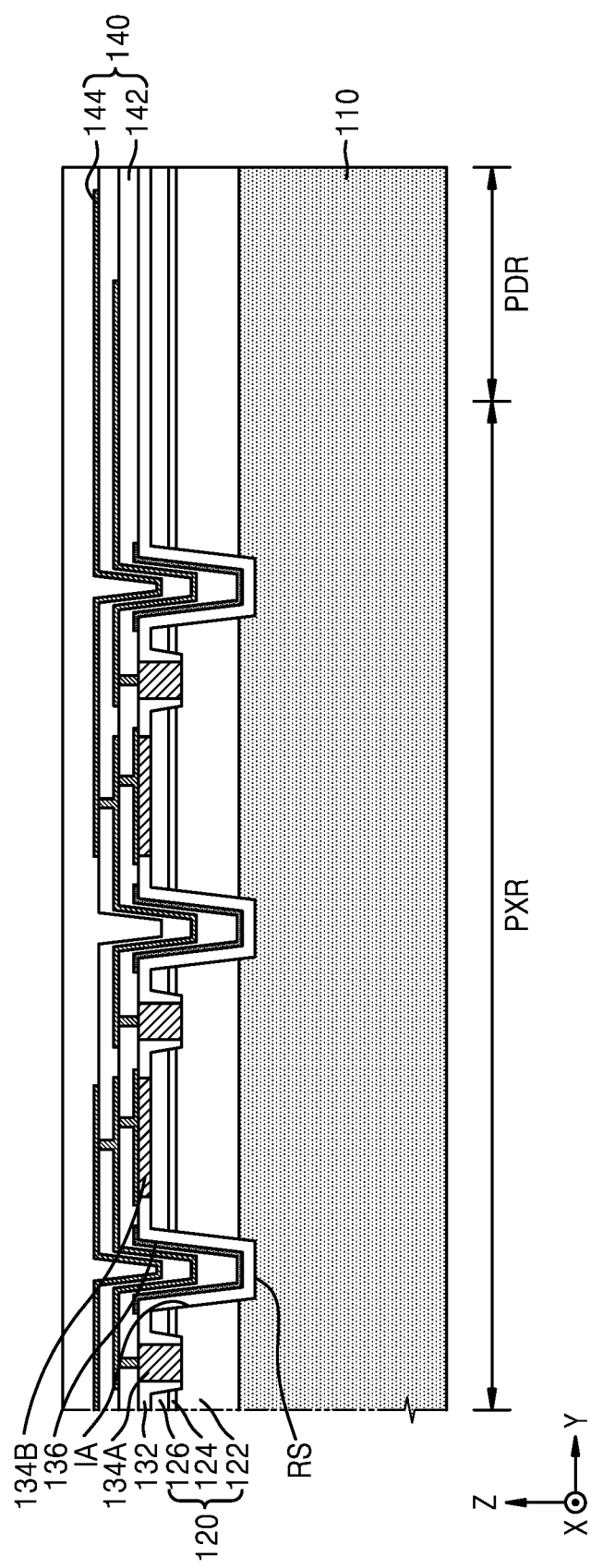

Referring to FIG. 9D, a wiring structure 140 may be formed on the insulating liner 132, the first contact 134A, the second contact 134B, and the lower reflective layer 136.

In some embodiments, a conductive layer may be formed on the insulating liner 132, the first contact 134A, the second contact 134B, and the lower reflective layer 136. The conductive layer may be patterned to form a wiring layer 144, and a process of forming an insulating layer 142 covering the wiring layer 144 may be repeated to form a wiring structure 140 including a plurality of wiring layers 144 and a plurality of insulating layers 142. In some embodiments, at least some of the wiring layers 144 may be formed by a plating process.

Figure 9E:
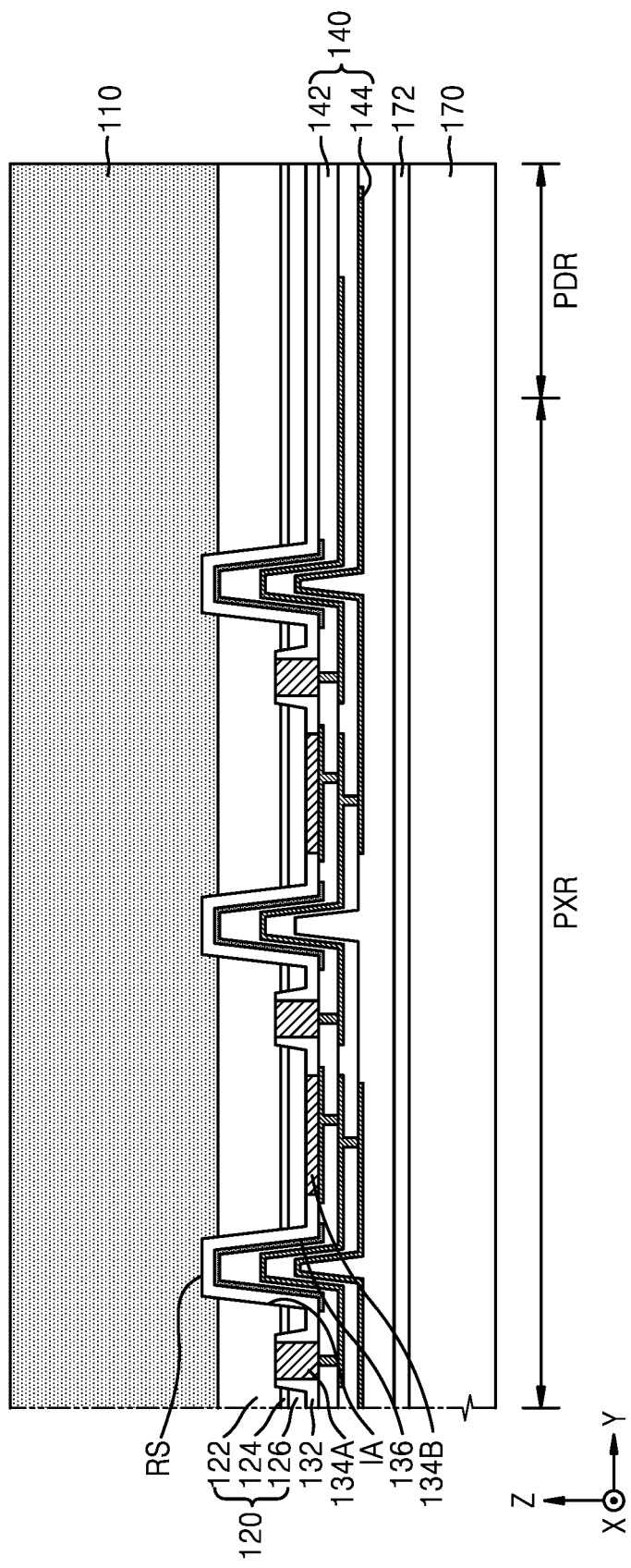

Referring to FIG. 9E, an adhesive layer 172 may be formed on the wiring structure 140, and a base substrate 170 may be attached to the adhesive layer 172.

Next, the base substrate 170 may be turned over so that a surface of the base substrate 170 opposite to a surface thereof in contact with the light emitting structure 120 of the substrate 110 faces upward. Thereafter, a portion of the substrate 110 may be removed by a grinding process by a certain thickness.

Figure 9F:
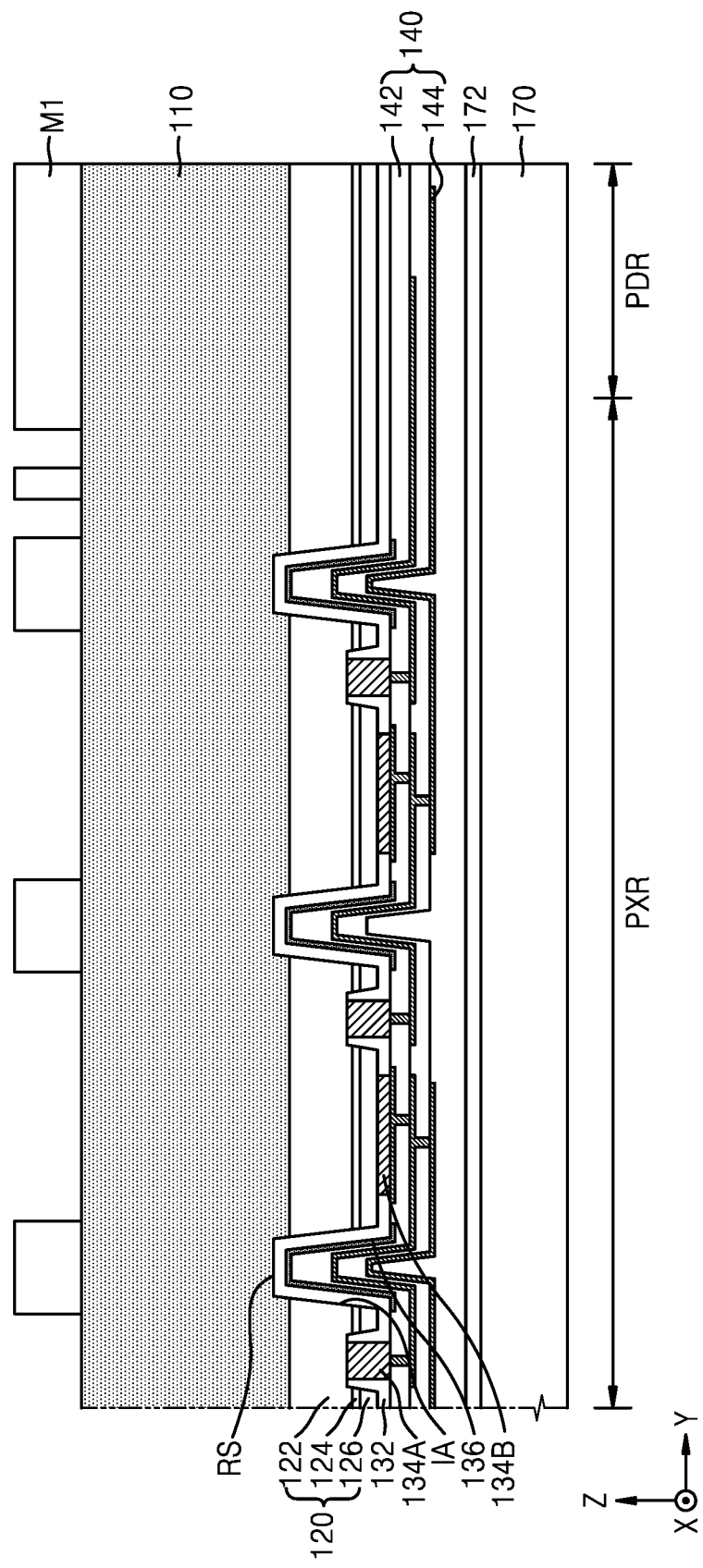

Referring to FIG. 9F, a first mask pattern M1 may be formed on the substrate 110.

The first mask pattern M1 may be an etch mask for forming a barrier rib structure WS (see FIG. 9G) and a dam structure WSD1 (see FIG. 9G) in the pixel region PXR of the substrate 110 by a photolithography process.

Figure 9G:
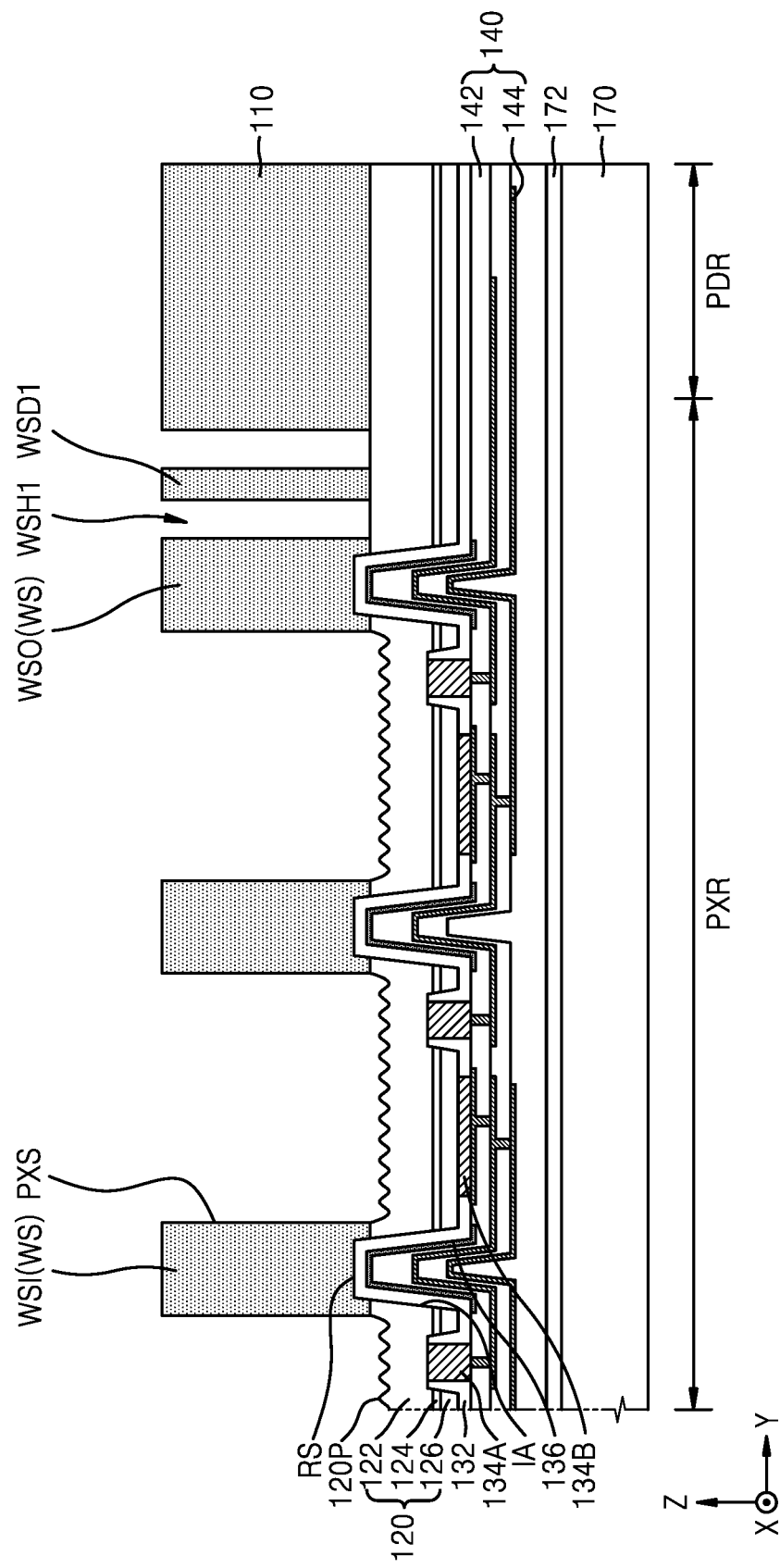

Referring to FIG. 9G, a portion of the substrate 110 may be removed using the first mask pattern M1 (see FIG. 9F) as an etch mask to form a plurality of pixel spaces PXS and a dam structure WSD1.

Thereafter, the first mask pattern M1 (see FIG. 9F) may be removed by an ashing and stripping process.

A portion of the substrate 110 positioned between the pixel spaces PXS in the pixel region PXR may be referred to as a plurality of barrier ribs WSI. The barrier ribs WSI may be positioned to vertically overlap the device isolation region IA, and the light emitting structures 120 may be positioned in the pixel spaces PXS, respectively. From bottom portions of the pixel spaces PXS, upper surfaces of the first conductivity-type semiconductor layer 122, that is, upper surfaces of the light emitting structures 120, may be exposed.

Next, an etching process may be performed on the first conductivity-type semiconductor layer 122 exposed to the bottom portions of the pixel spaces PXS to form uneven portions 120P. In some embodiments, the etching process for forming the uneven portions 120P may be omitted.

Figure 9H:
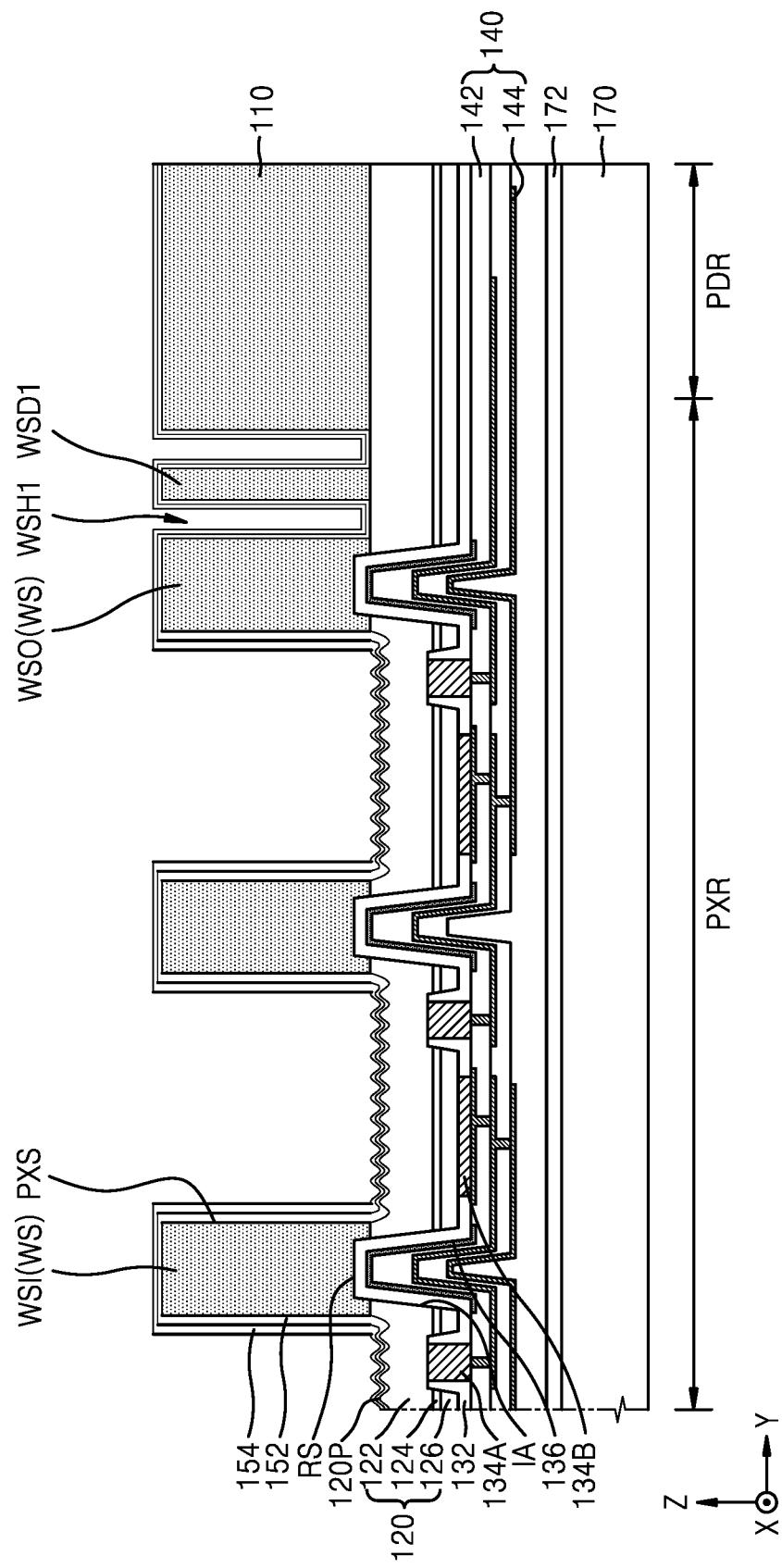

Referring to FIG. 9H, first and second passivation layers 152 and 154 may be formed on the barrier rib structure WS and the substrate 110.

The first passivation layer 152 may be formed on upper surfaces and sidewalls of the barrier rib structure WS and the dam structure WSD1. The first passivation layer 152 may be further formed on the upper surfaces of the light emitting structures 120.

Thereafter, the second passivation layer 154 may be formed on the first passivation layer 152. The second passivation layer 154 may be formed on upper surfaces and sidewalls of the barrier rib structure WS and the dam structure WSD1. The second passivation layer 154 may be further formed on the upper surfaces of the light emitting structures 120.

Figure 9I:
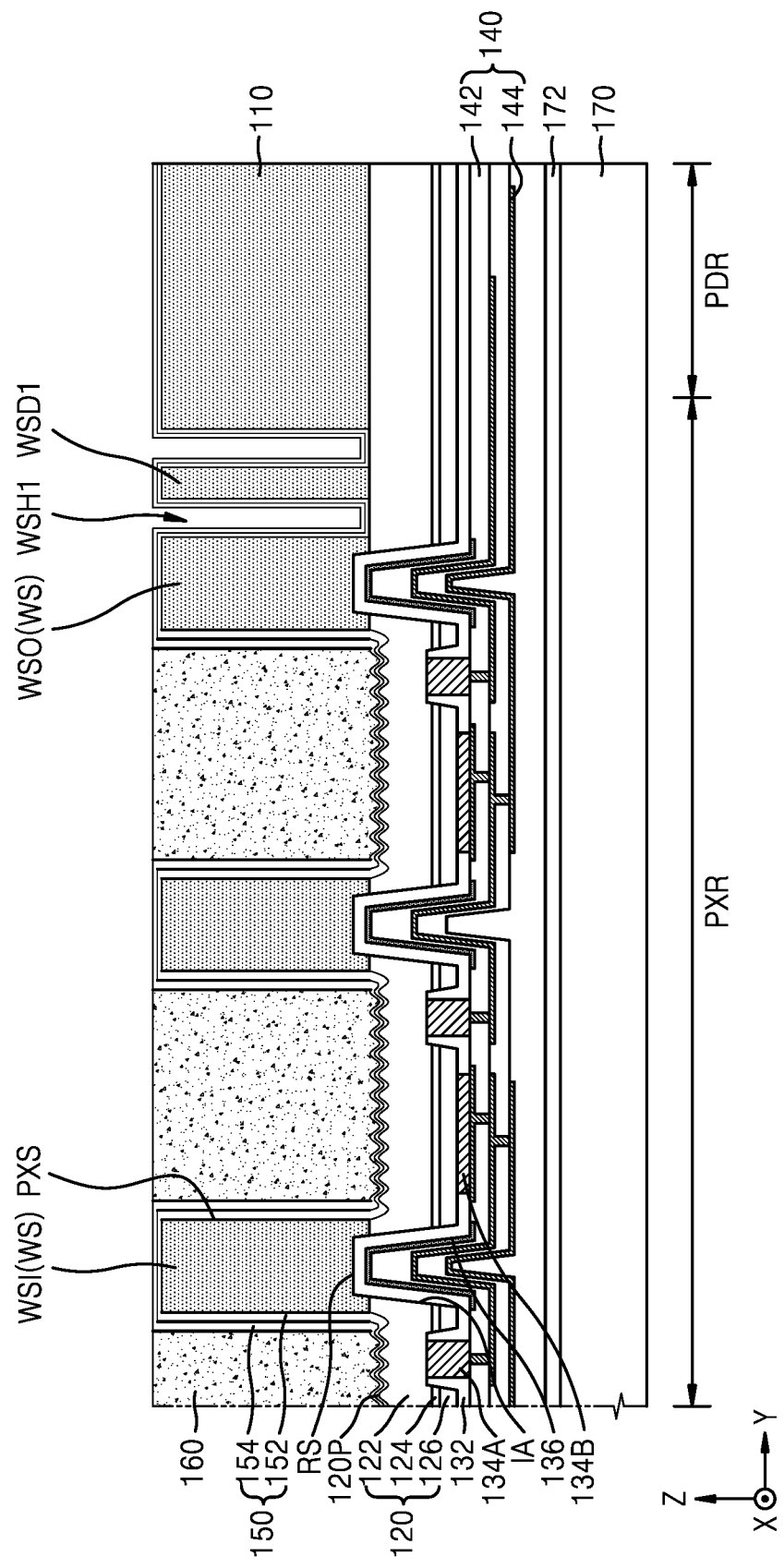

Referring to FIG. 9I, a phosphor layer 160 filling an inside of each of the pixel spaces PXS may be formed.

In some embodiments, the phosphor layer 160 may be formed by applying or dispensing a resin in which phosphor particles are dispersed to the pixel spaces PXS.

Figure 9J:
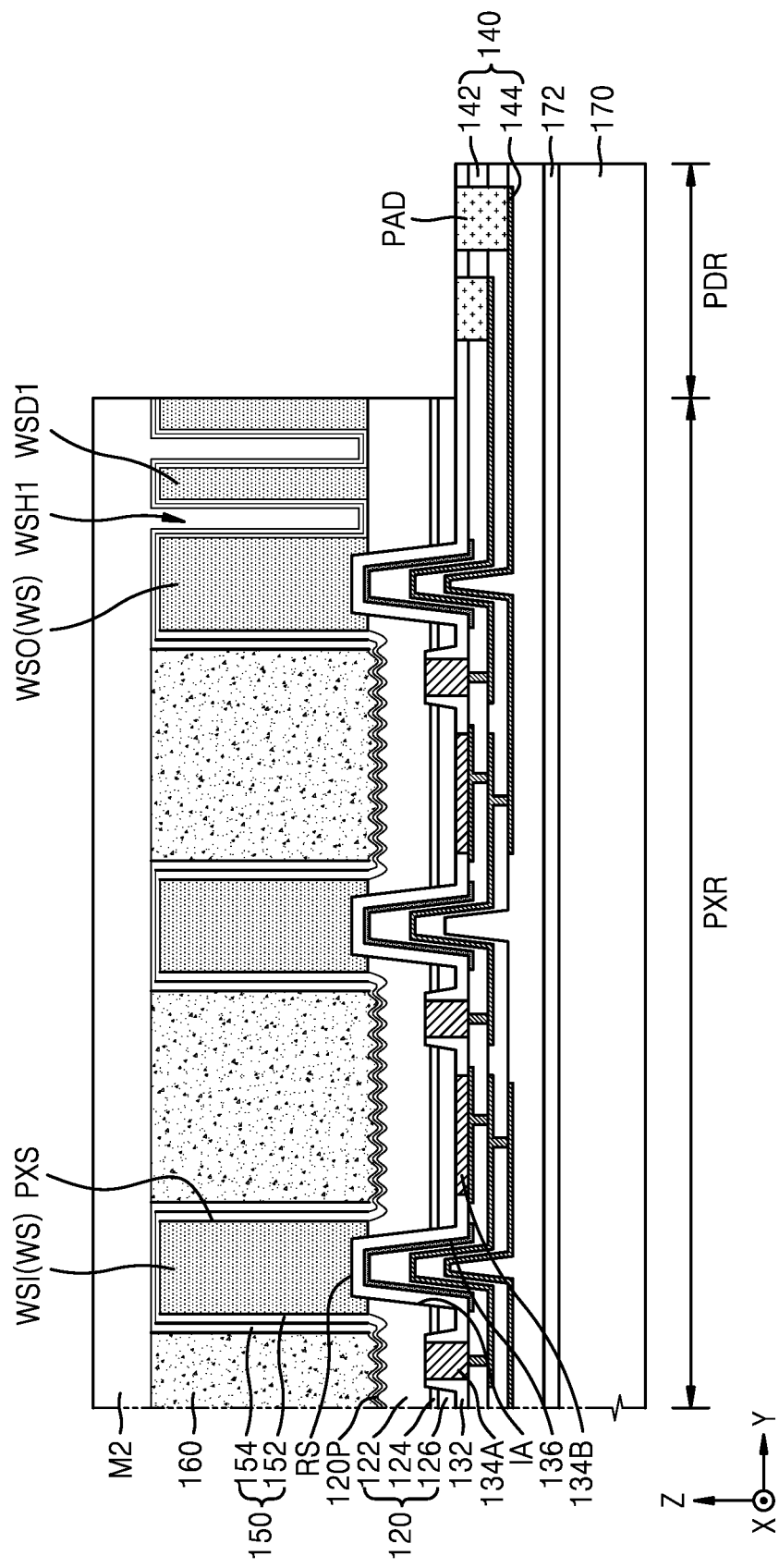

Referring to FIG. 9J, a second mask pattern M2 covering the phosphor layer 160, the barrier rib structure WS, and the dam structure WSD1 is formed on the pixel region PXR, and a portion of the substrate 110 may be removed using the second mask pattern M2 as an etch mask.

Thereafter, the light emitting stack 120L exposed to an outer side of the dam structure WSD1 may be removed to expose the wiring structure 140. Thereafter, an opening may be formed in the wiring structure 140, and the opening may be filled with a conductive material to form a pad portion PAD.

Figure 9K:
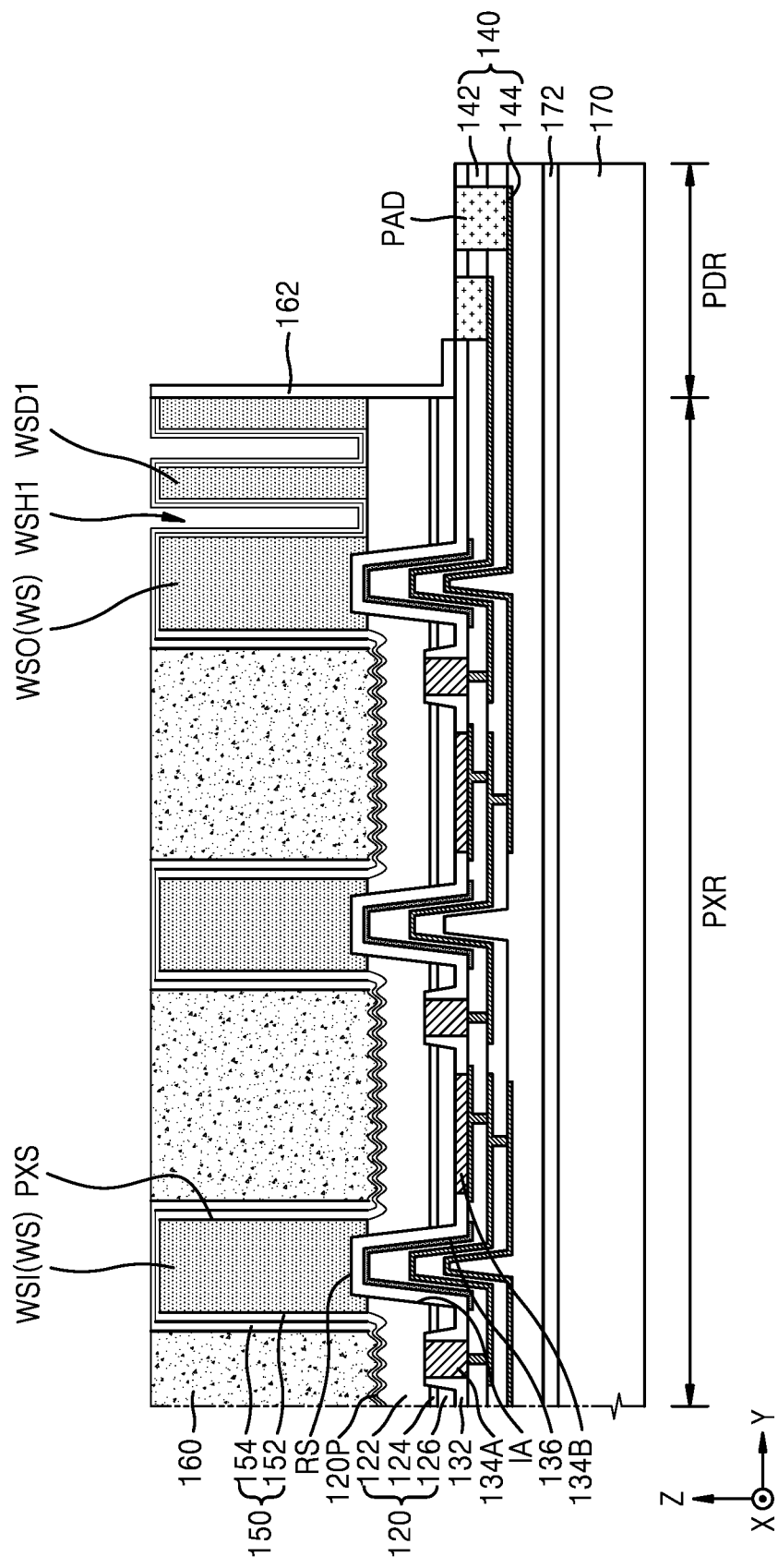

Referring to FIG. 9K, the second mask pattern M2 (see FIG. 9J) may be removed by ashing and stripping processes.

Thereafter, an edge protection layer 162 may be formed on an outer wall of the dam structure WSD1 using an insulating material.

Figure 9L:
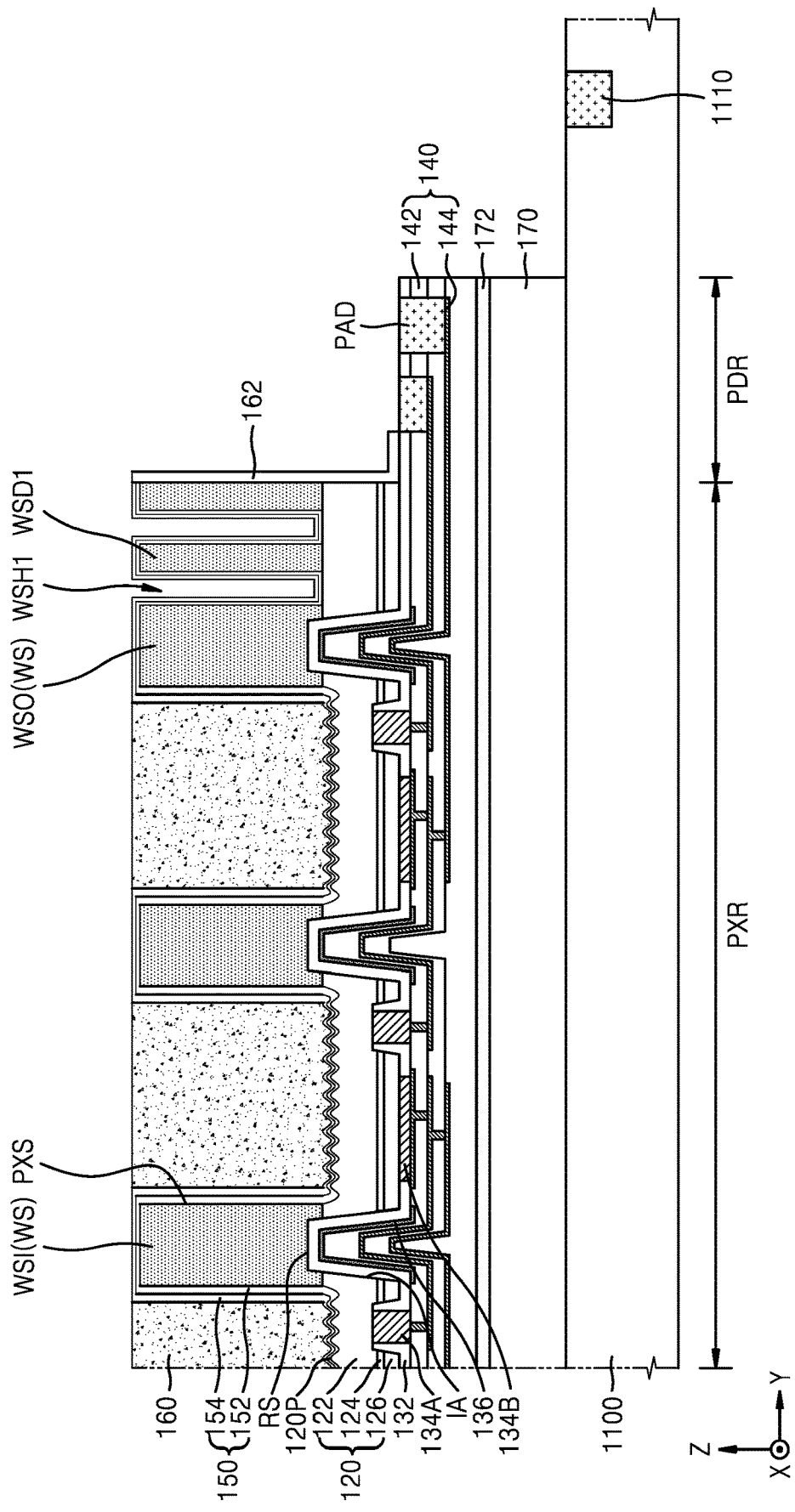

Referring to FIG. 9L, the base substrate 170 may be mounted on the PCB 1100.

The base substrate 170 may be mounted on a mounting area of the PCB 1100 so that the connection pad 1110 on the PCB 1100 is exposed. An adhesive layer (not shown) may be formed between the PCB 1100 and the base substrate 170.

Figure 9M:
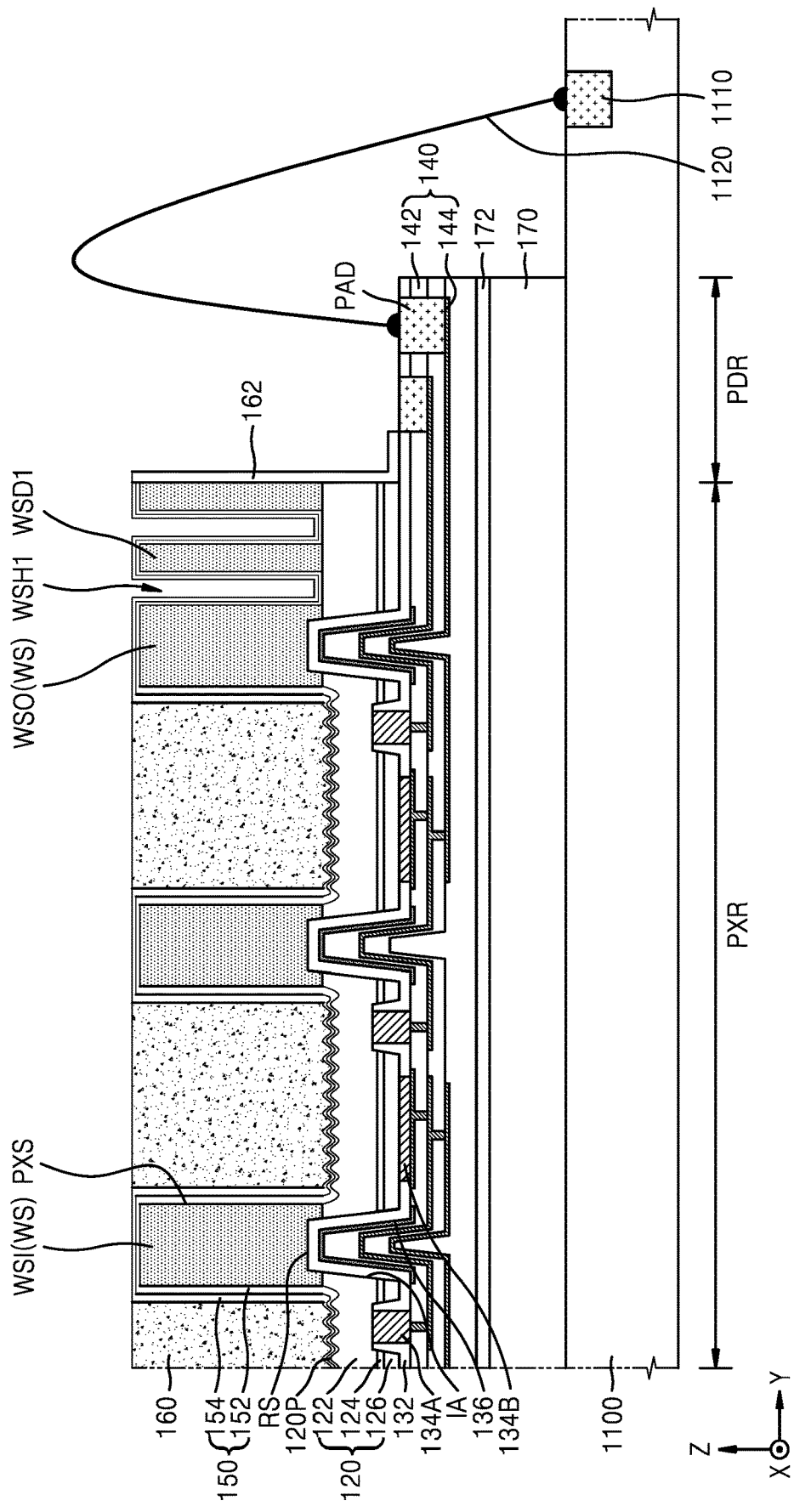

Referring to FIG. 9M, a bonding wire 1120 electrically connecting the pad portion PAD to the connection pad 1110 may be formed.

The bonding wire 1120 may be connected by any one of thermo compression bonding and ultrasonic connection method or may be connected by a thermosonic connection method as a combination of the thermo compression connection method and the ultrasonic connection method. A level of the uppermost surface of a loop height formed by the bonding wire 1120 may be higher than a level of the uppermost surface of the barrier rib structure WS.

Referring back to FIG. 1C, the molding structure 1130 may be formed to cover the bonding wire 1120. An exterior of the molding structure 1130 is formed by injecting an appropriate amount of a molding material and performing a curing process. By the processes described above, the light emitting device 100 of the inventive concept may be completed.

According to the method of manufacturing the light emitting device 100 according to the technical concept of the inventive concept, the first space WSH1 and the dam structure WSD1 are arranged to surround the outer barrier rib WSO, and may prevent a molding material of the molding structure 1130 from flowing into the light emitting pixel region PX4, thereby providing the pixel-type semiconductor light emitting device 100 having excellent optical characteristics and reliability.

Figure 10:
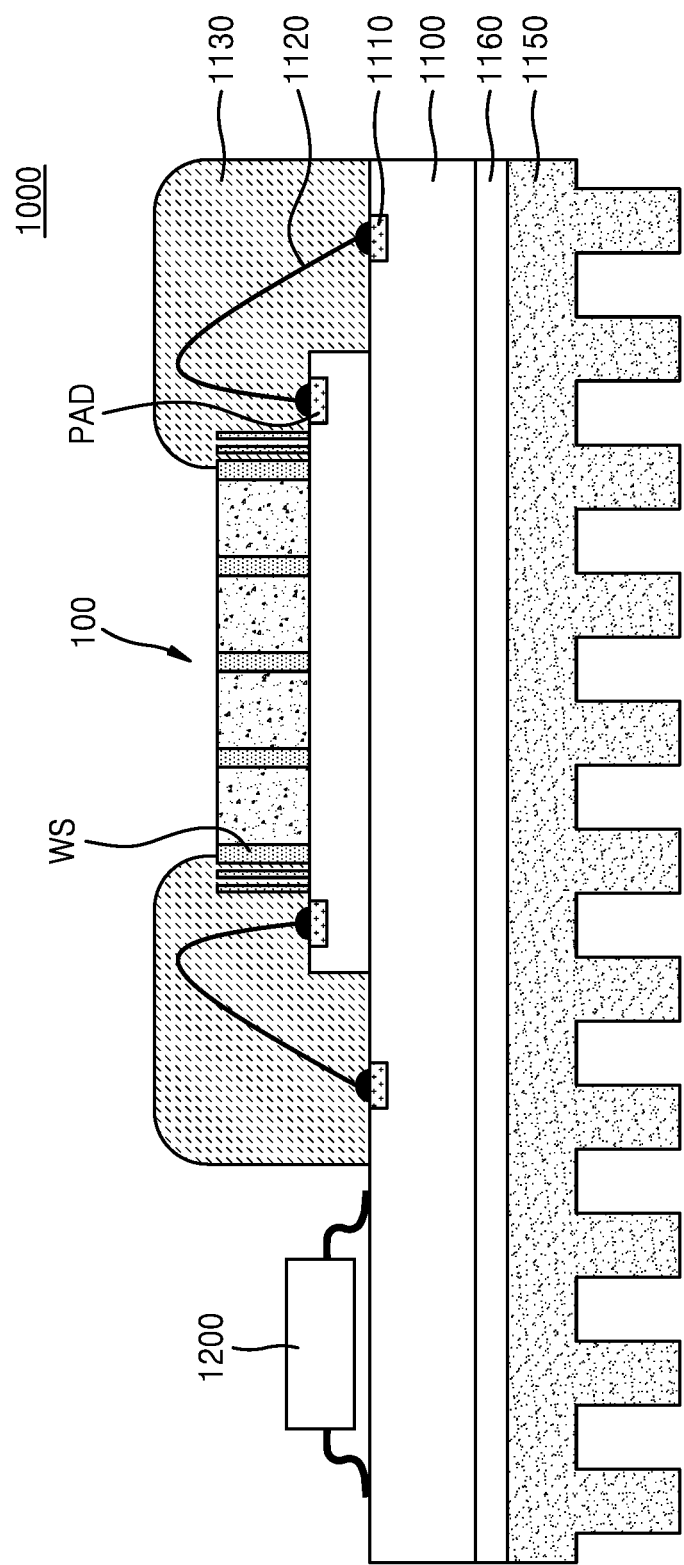
FIG. 10 is a cross-sectional view illustrating a light source module including a light emitting device according to an embodiment of the inventive concept.

FIG. 10 is a cross-sectional view illustrating a light source module 1000 including a light emitting device according to an embodiment of the inventive concept.

Referring to FIG. 10, the light source module 1000 may include the light emitting device 100 and a driving semiconductor chip 1200.

The PCB 1100 may include an internal conductive pattern layer (not shown), and may include the connection pad 1110 electrically connected to the internal conductive pattern layer. The pad portion PAD of the light emitting device 100 may be connected to the connection pad 1110 of the PCB 1100 through the bonding wire 1120. One or more driving semiconductor chips 1200 may be configured to individually or entirely drive the light emitting structures 120 (see FIG. 1C) of the light emitting device 100.

A heat sink 1150 may be attached to a bottom surface of the PCB 1100, and a thermal interface material (TIM) layer 1160 may be optionally positioned between the heat sink 1150 and the PCB 1100.

The light emitting devices 100, 200, 300, 400, 500, 600, 700, and 800 described above may be mounted on the light source module 1000, alone or in combination.

Figure 11:
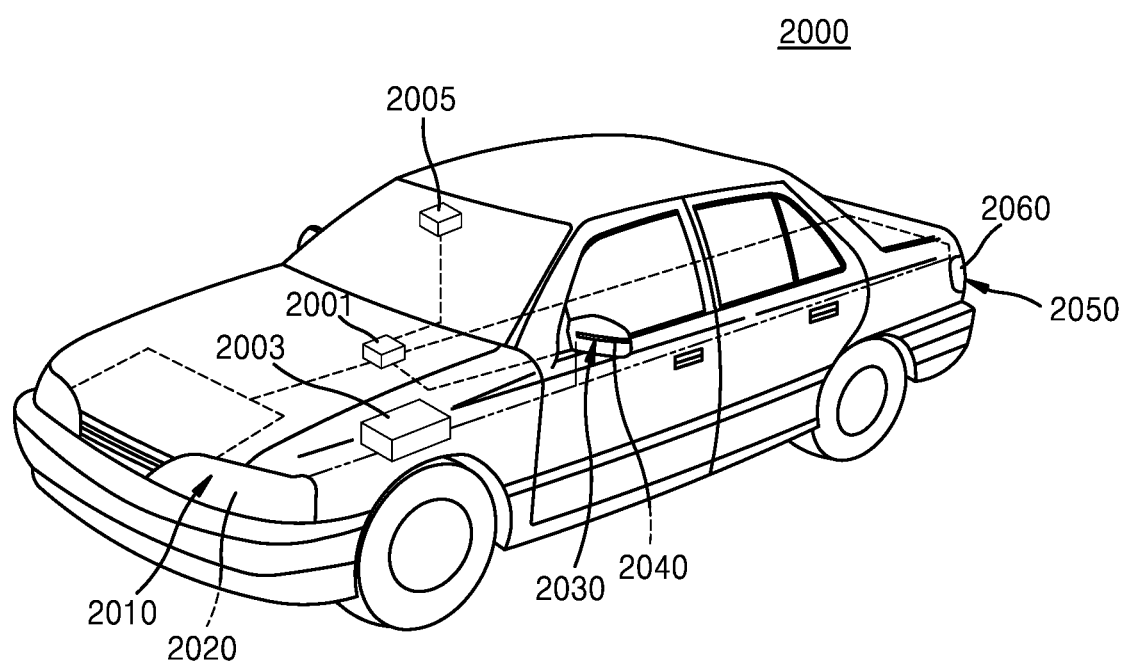
FIG. 11 is a perspective view illustrating a vehicle according to an embodiment of the inventive concept.

FIG. 11 is a perspective view illustrating a vehicle 2000 according to an embodiment of the inventive concept.

Although an automobile is illustrated as the vehicle 2000 in the drawing, the inventive concept is not limited thereto. The vehicle 2000 may include land transportation means such as two-wheeled vehicles, three-wheeled vehicles, passenger cars, caterpillar tractors, trains, and trolleys, marine transportation means such as ships, boats, and submarines, and air transportation means such as airplanes and helicopters, but is not particularly limited.

Referring to FIG. 11, a head lamp module 2020 may be installed in a head lamp unit 2010 of the vehicle 2000, a side mirror lamp module 2040 may be installed in an external side mirror unit 2030, and a tail lamp module 2060 may be installed in a tail lamp unit 2050.

The head lamp module 2020 may include a light source module including the light emitting devices 100, 200, 300, 400, 500, 600, 700, and 800 as described above, alone or in combination.

A power supply device 2003 embedded in the vehicle 2000 may supply power to each of the head lamp module 2020, the side mirror lamp module 2040, and the tail lamp module 2060. A controller 2001 built in the vehicle 2000 may be configured to control general operations including switching the head lamp module 2020, the side mirror lamp module 2040, and the tail lamp module 2060 on or off.

The controller 2001 may be the driving semiconductor chip 1200 (see FIG. 10) as described above, or may be configured to be electrically connected to the driving semiconductor chip 1200 (see FIG. 10) to control the driving semiconductor chip 1200 (see FIG. 10).

The vehicle 2000 may further include a vision recognition device 2005. The vision recognition device 2005 may be configured to detect an object in front of or around the vehicle 2000 and movement thereof. The vision recognition device 2005 may include a camera receiving a front view and converting the received front view into digital data, a processor identifying a position to be irradiated with light emitted from the head lamp module 2020 and a position not to be irradiated with light using a conversion digital data result, and an output device transmitting a process result from the processor to the controller 2001.

Figure 12:
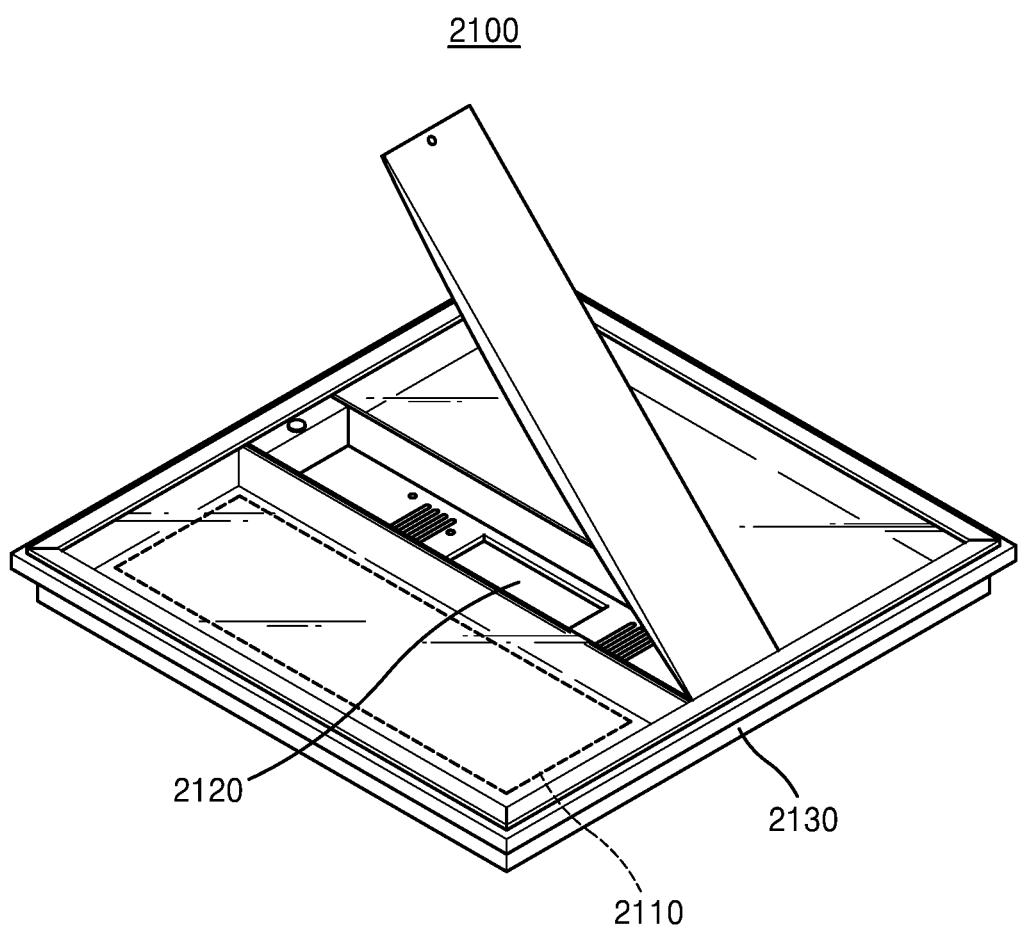
FIG. 12 is a perspective view illustrating a lighting device including a light emitting device according to an embodiment of the inventive concept.

FIG. 12 is a perspective view illustrating a lighting device (including a flat panel lighting device 2100) including a light emitting device according to an embodiment of the inventive concept.

Referring to FIG. 12, the flat panel lighting device 2100 may include a light source module 2110, a power supply device 2120, and a housing 2130.

The light source module 2110 may include a light emitting device array as a light source, or may include at least one of the light emitting devices 100, 200, 300, 400, 500, 600, 700, and 800 as described above as a light source. The light source module 2110 may be formed to have a planar shape as a whole.

The power supply device 2120 may be configured to supply power to the light source module 2110. The housing 2130 may have an accommodation space to accommodate the light source module 2110 and the power supply device 2120 therein, and may have a hexahedral shape with one side open, but is not limited thereto. The light source module 2110 may be positioned to emit light to the open side of the housing 2130.

Figure 13:
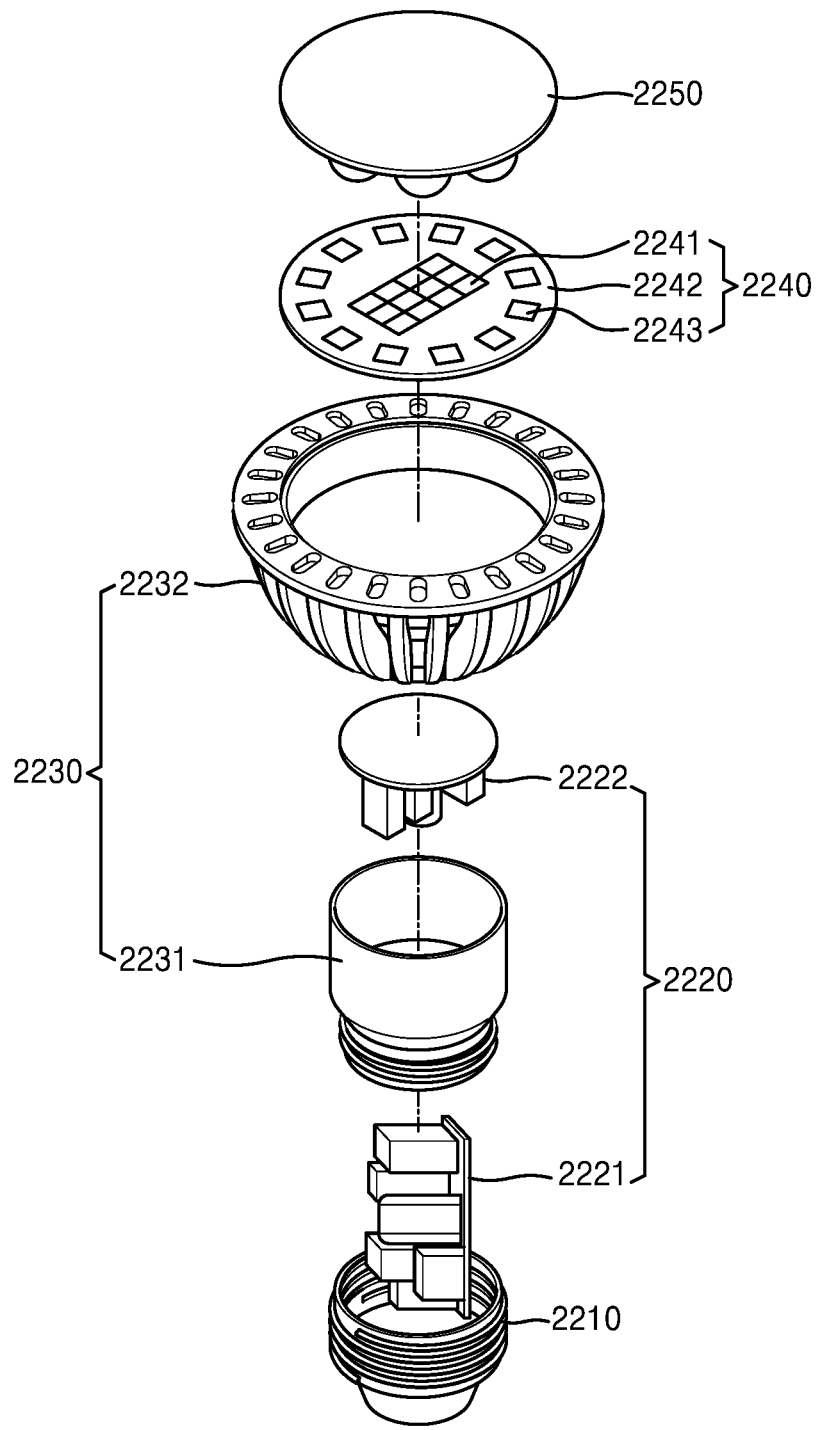
FIG. 13 is an exploded perspective view illustrating a lighting device including a light emitting device according to an embodiment of the inventive concept.

FIG. 13 is an exploded perspective view illustrating a lighting device 2200 including a light emitting device according to an embodiment of the inventive concept.

Referring to FIG. 13, the lighting device 2200 may include a socket 2210, a power supply unit 2220, a heat dissipation unit 2230, a light source module 2240, and an optical unit 2250.

The socket 2210 may be configured to be replaceable with an existing lighting device. Power supplied to the lighting device 2200 may be applied through the socket 2210. The power supply unit 2220 may include a first power supply unit 2221 and a second power supply unit 2222, and the first power supply unit 2221 and the second power supply unit 2222 may be assembled. The heat dissipation unit 2230 may include an internal heat dissipation unit 2231 and an external heat dissipation unit 2232, and the internal heat dissipation unit 2231 may be directly connected to the light source module 2240 and/or the power supply unit 2220, so that heat may be transferred to the external heat dissipation unit 2232.

The light source module 2240 may emit light to the optical unit 2250, upon receiving power from the power supply unit 2220. The light source module 2240 may include a light emitting device package 2241, a circuit board 2242, and a controller 2243, and the controller 2243 may store driving information of the light emitting device package 2241. The light emitting device package 2241 may include at least one of the light emitting devices 100, 200, 300, 400, 500, 600, 700, and 800 as described above, as a light source.

The optical unit 2250 may include an internal optical unit (not shown) and an external optical unit (not shown), and may be configured to evenly distribute light emitted from the light source module 2240.

While the inventive concept has been particularly shown and described with reference to embodiments thereof, it will be understood that various changes in form and details may be made therein without departing from the spirit and scope of the following claims.

What is claimed is:

1. A light emitting device comprising:
a printed circuit board (PCB) including a connection pad;
a base substrate mounted on the PCB and including a light emitting pixel region and a pad region;
a plurality of light emitting structures arranged on the light emitting pixel region;
a barrier rib structure disposed on the light emitting pixel region and disposed at a vertical level different from the plurality of light emitting structures,
wherein the barrier rib structure includes a plurality of barrier ribs connected with each other to define each of a plurality of pixel spaces;
a phosphor layer filling an inside of each of the plurality of pixel spaces;
a dam structure surrounding the barrier rib structure;
a pad disposed on the pad region and being adjacent to at least one side of an outer boundary of the plurality of light emitting structures;
a bonding wire connecting the connection pad to the pad; and
a molding structure covering the pad, the connection pad, the bonding wire, and at least a portion of the dam structure.

2. The light emitting device of claim 1, further comprising:
a first space between the barrier rib structure and the dam structure, and
wherein the molding structure fills at least a portion of the first space.

3. The light emitting device of claim 2,
wherein a vertical level of a bottom surface of the first space is equal to or lower than a vertical level of a lower surface of the barrier rib structure.

4. The light emitting device of claim 2,
wherein the first space is of a continuous line shape and surrounds the barrier rib structure.

5. The light emitting device of claim 2,
wherein the first space surrounds the barrier rib structure, and
wherein a shape of the first space is at least one selected from among a closed shape, a line shape, a rectangle shape, and a circle shape.

6. The light emitting device of claim 1,
wherein the barrier rib structure includes substantially the same material as a material of the dam structure, and
wherein a level of an upper surface of the barrier rib structure is substantially the same as a level of an upper surface of the dam structure.

7. The light emitting device of claim 1,
wherein the dam structure is positioned between the barrier rib structure and the pad,
wherein the dam structure includes a plurality of dams, and
wherein the plurality of dams are arranged in a direction away from the barrier rib structure.

8. The light emitting device of claim 7,
wherein the plurality of dams are positioned to be spaced apart from each other at a substantially equal interval.

9. The light emitting device of claim 1,
wherein the bonding wire has a curved portion between the connection pad and the pad,
wherein a level of an uppermost surface of the curved portion of the bonding wire is higher than a level of an uppermost surface of the barrier rib structure, and
wherein the molding structure has a round upper surface and covers the bonding wire entirely.

10. The light emitting device of claim 9,
wherein the molding structure covers a side surface of the base substrate and a portion of an upper surface of the PCB.

11. A light emitting device comprising:
a printed circuit board (PCB) including a connection pad;
a base substrate mounted on the PCB and including a light emitting pixel region and a pad region;
a plurality of light emitting structures arranged on the light emitting pixel region;
a barrier rib structure disposed on the light emitting pixel region and disposed at a vertical level different from the plurality of light emitting structures,
wherein the barrier rib structure includes a plurality of barrier ribs connected with each other to define a plurality of pixel spaces;
a phosphor layer filling an inside of each of the plurality of pixel spaces;
a pad disposed on the pad region and being adjacent to at least one side of an outer boundary of the plurality of light emitting structures;
a bonding wire connecting the connection pad to the pad; and
a molding structure covering the pad, the connection pad, the bonding wire, and at least a portion of an outer portion of the barrier rib structure,
wherein the outer portion of the barrier rib structure includes a stepped outer portion, and
wherein the molding structure covers the stepped outer portion.

12. The light emitting device of claim 11,
wherein the stepped outer portion is positioned between the phosphor layer and the pad, and
wherein at least a portion of the stepped outer portion of the barrier rib structure contacts the molding structure.

13. The light emitting device of claim 12, further comprising:
a recessed space provided at an upper surface of the stepped outer portion of the barrier rib structure,
wherein the molding structure fills at least a portion of the recessed space.

14. The light emitting device of claim 11,
wherein the bonding wire has a curved portion between the connection pad and the pad,
wherein a level of an uppermost surface of the curved portion of the bonding wire is higher than a level of an uppermost surface of the barrier rib structure, and
wherein the molding structure has a round upper surface and covers the bonding wire entirely.

15. The light emitting device of claim 11,
wherein the molding structure covers a side surface of the base substrate and a portion of an upper surface of the PCB.

16. A light emitting device comprising:
a printed circuit board (PCB) including a connection pad;
a base substrate mounted on the PCB and including a light emitting pixel region and a pad region;
a plurality of light emitting structures arranged on the light emitting pixel region;
a barrier rib structure disposed on the light emitting pixel region and disposed at a vertical level different from the light emitting structures,
wherein the barrier rib structure includes a plurality of barrier ribs connected with each other to define a plurality of pixel spaces;
a phosphor layer filling an inside of each of the plurality of pixel spaces;
a pad disposed on the pad region and being adjacent to at least one side of an outer boundary of the plurality of light emitting structures;
a bonding wire connecting the connection pad to the pad; and
a molding structure covering the pad, the connection pad, the bonding wire, and at least a portion of an outer portion of the barrier rib structure,
wherein the outer portion of the barrier rib structure includes a rounded outer portion, and
wherein the molding structure covers the rounded outer portion.

17. The light emitting device of claim 16,
wherein the rounded outer portion of the barrier rib structure is positioned between the phosphor layer and the pad, and
wherein at least a portion of the rounded outer portion of the barrier rib structure contacts the molding structure.

18. The light emitting device of claim 17, further comprising:
a recessed space provided at an upper surface of the rounded outer portion of the barrier rib structure, and wherein the molding structure fills at least a portion of the recessed space.

19. The light emitting device of claim 16, wherein the bonding wire has a curved portion between the connection pad and the pad, wherein a level of an uppermost surface of the curved portion of the bonding wire is higher than a level of an uppermost surface of the barrier rib structure, and wherein the molding structure has a round upper surface and covers the bonding wire entirely.

20. The light emitting device of claim 16, wherein the molding structure covers a side surface of the base substrate and a portion of an upper surface of the PCB.

\* \* \* \* \*